United States Patent
Sira et al.

(10) Patent No.: US 11,552,030 B2
(45) Date of Patent: Jan. 10, 2023

(54) HIGH FREQUENCY CAPACITOR WITH INDUCTANCE CANCELLATION

(71) Applicant: INTEL CORPORATION, Santa Clara, CA (US)

(72) Inventors: Daniel Sira, Munich (DE); Domagoj Siprak, Munich (DE); Jonas Fritzin, Munich (DE)

(73) Assignee: Intel Corporation, Santa Clara, CA (US)

( * ) Notice: Subject to any disclaimer, the term of this patent is extended or adjusted under 35 U.S.C. 154(b) by 865 days.

(21) Appl. No.: 16/051,376

(22) Filed: Jul. 31, 2018

(65) Prior Publication Data
US 2020/0043874 A1 Feb. 6, 2020

(51) Int. Cl.
| | |
|---|---|
| *H01L 23/522* | (2006.01) |
| *H01L 23/66* | (2006.01) |
| *H01L 49/02* | (2006.01) |
| *H01L 27/06* | (2006.01) |
| *H01L 23/482* | (2006.01) |
| *G06F 30/367* | (2020.01) |

(52) U.S. Cl.
CPC ............ *H01L 23/66* (2013.01); *G06F 30/367* (2020.01); *H01L 23/4824* (2013.01); *H01L 23/5223* (2013.01); *H01L 23/5227* (2013.01); *H01L 23/5228* (2013.01); *H01L 27/0629* (2013.01); *H01L 28/86* (2013.01); *H01L 28/90* (2013.01); *H01L 2223/6611* (2013.01); *H01L 2223/6655* (2013.01); *H01L 2223/6672* (2013.01)

(58) Field of Classification Search
None
See application file for complete search history.

(56) References Cited

U.S. PATENT DOCUMENTS

| | | |
|---|---|---|
| 5,583,359 A | 12/1996 | Ng et al. |
| 6,743,671 B2 | 6/2004 | Hu et al. |
| (Continued) | | |

FOREIGN PATENT DOCUMENTS

WO 2018004563 1/2018

OTHER PUBLICATIONS

PCT Search Report and Written Opinion for PCT Application No. PCT/US2016/040036, dated Mar. 17, 2017, 7 pages.

*Primary Examiner* — Benjamin P Sandvik
(74) *Attorney, Agent, or Firm* — Schwabe, Williamson & Wyatt, P.C.

(57) ABSTRACT

An integrated circuit structure includes a first metallization layer with first and second electrodes, each of which has electrode fingers. A second metallization layer may be included below the first metallization layer and include one or more electrodes with electrode fingers. The integrated circuit structure is configured to exhibit at least partial vertical inductance cancellation when the first electrode and second electrode are energized. The integrated circuit structure can be configured to also exhibit horizontal inductance cancellation between adjacent electrode fingers. Also disclosed is a simulation model that includes a capacitor model that models capacitance between electrode fingers having a finger length and includes at least one resistor-capacitor series circuit in which a resistance of the resistor increases with decreasing finger length for at least some values of the finger length.

20 Claims, 12 Drawing Sheets

(56) References Cited

U.S. PATENT DOCUMENTS

| | | | |
|---|---|---|---|
| 6,816,356 B2 | 11/2004 | Devoe et al. | |
| 7,561,407 B1* | 7/2009 | Chen | H01G 4/228 |
| | | | 361/321.1 |
| 8,099,270 B2 | 1/2012 | Pawlikiewicz | |
| 9,524,964 B2 | 12/2016 | Jing et al. | |
| 2012/0091560 A1 | 4/2012 | Riess et al. | |
| 2012/0092806 A1 | 4/2012 | Hua et al. | |
| 2013/0334658 A1* | 12/2013 | Cai | H01L 23/49589 |
| | | | 257/532 |
| 2015/0022948 A1* | 1/2015 | An | H01G 4/232 |
| | | | 361/303 |
| 2019/0189608 A1* | 6/2019 | Cheng | H01L 23/5223 |
| 2019/0259701 A1* | 8/2019 | Cheng | H01L 23/5227 |
| 2019/0378793 A1* | 12/2019 | Cheng | H01L 27/0629 |

* cited by examiner

US 11,552,030 B2

HIGH FREQUENCY CAPACITOR WITH INDUCTANCE CANCELLATION

BACKGROUND

Capacitors are one of many components found in integrated circuits. For example, integrated circuits for radio-frequency (RF) signal applications, memory structures, and other applications may include capacitor structures. Capacitance can be achieved when metal structures of different electrical potential are positioned adjacent one another. Capacitance can be intentional or an inadvertent consequence of integrated circuit design. Also, an induced magnetic field, or inductance, may result from current flow through structures in integrated circuits. The magnitude and properties of capacitance and inductance depend at least in part on the arrangement and geometry of metal and other charge-carrying structures, electrical potentials, and current flows in an integrated circuit. Accordingly, many non-trivial issues exist in the design and implementation of capacitors in integrated circuits.

Figure 1:
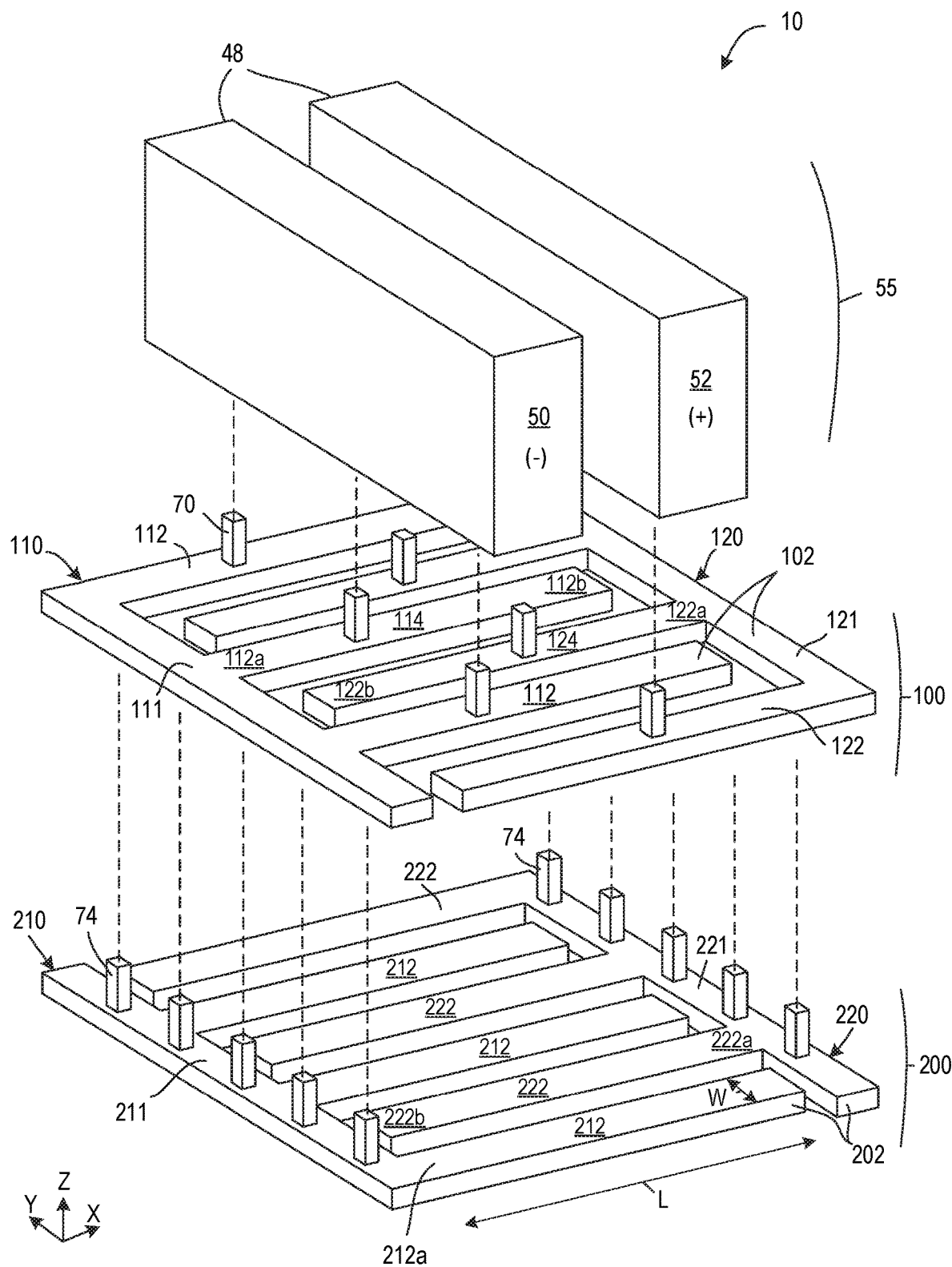
FIG. 1 is a perspective, exploded view of a capacitor structure with first and second electrode pairs, where the capacitor structure is configured for vertical and horizontal capacitance as well as inductance cancellation in the horizontal and vertical directions, in accordance with an embodiment of the present disclosure.

The figures depict various embodiments of the present disclosure for purposes of illustration only. Numerous variations, configurations, and other embodiments will be apparent from the following detailed discussion.

DETAILED DESCRIPTION

The present disclosure is directed to a metal-dielectric-metal capacitor structure formed as part of an integrated circuit suitable for high frequency applications. Capacitors show a current flow when an electrical potential between electrodes is changed dynamically, i.e. a dynamic change of potential difference between two electrodes occurs according to the expression I=C dV/dt, where I is current, C is capacitance, V is voltage, and t is time. The current flow is proportional to the capacitance value. The dynamically increasing potential (i.e. a changing electrical potential) of a first electrode can be denoted with a plus sign (+) with respect to the dynamically decreasing potential (i.e. a changing electrical potential) of a second electrode denoted with a minus sign (−). The coupled line can be driven also by a common mode excitation, where the potential on the first line and the second line is increasing or decreasing by the same amount in both lines, i.e. there is no potential difference between both lines. Such a dynamically change of potential in conductors leads to a changing current flow. A current flow in a conductor leads to a magnetic field. Dynamically changing magnetic fields lead to potential differences within an open loop conductor, which in turn can cause a current flow in a closed loop conductor. The potential differences induced by changing magnetic fields are proportional to the inductance of the conductor.

The embodiments of the capacitor structure exhibit inductance cancellation. The term "inductance cancellation" refers to an inductance coupling that leads to decreased mutual inductance compared to the reference case where the fingers (or coupled lines) are placed next to each other and current flows in the same direction through the fingers (or coupled lines). The effect of inductance cancellation depends on multiple factors like finger geometry, finger spacing in a vertical and/or horizontal direction, the direction of current flow through fingers, and spatial orientation of fingers in three-dimensional space. The inductance cancellation effect might appear only on a part of the finger length and then it is referred to as "partial inductance cancellation". In some embodiments the coupled line exhibits inductance cancellation when excited in differential mode.

Mutual inductance of two metal wires can be expressed mathematically by Equation 1 and Equation 2, below. Although discussed with reference to wires, these equations also apply to inductance between two coupled lines, two electrode fingers, or any two metal wires or metal structures.

$$V_1 = L_1 \times di_1/dt + M_{12} di_2/dt \quad \text{Equation 1}$$

$$V_2 = M_{21} \times di_1/dt + L_2 \times di_2/dt \quad \text{Equation 2}$$

Where $M_{21} = M_{12}$ and
$V_1$ is the voltage of the first wire,
$V_2$ is the voltage of the second wire,
$L_1$ is the self inductance of the first wire in the absence of any other wire,
$L_2$ is the self inductance of the second wire in the absence of any other wire,
$M_{12}$ is the mutual inductance from wire 1 to wire 2, and
$M_{21}$ is the mutual inductance from wire 2 to wire 1.

In the reference case, current in each of the first and second wires flows in the same direction and $M_{12}$ and $M_{21}$ have a positive value. Accordingly, the mutual inductance M adds to the self-inductance L. At the limit, mutual inductance enhances the self-inductance and V=2 Ldi/dt. In the case of inductance cancellation, current in the first and second wires flows in the opposite direction and $M_{12}$ and $M_{21}$ have a negative value. Accordingly, the self-inductance L is reduced by mutual inductance M. At the limit of inductance cancellation, the mutual inductance term cancels the self-inductance term in the equations and V=0.

Some embodiments of the capacitor structure can be configured to have at least partial vertical inductance cancellation. Benefits of such configurations include a capacitor structure with high capacitance density, a high resonant frequency, and/or a high Q-factor (quality factor). For example, capacitors configured according to some embodiments of the present disclosure are suitable for millimeter wave communications, millimeter wave radar, millimeter wave sensing, millimeter wave scanning and millimeter wave imaging technologies.

In one example embodiment, the capacitor structure includes a first electrode pair in a first metallization layer and a second electrode pair in a second metallization layer below the first metallization layer. The capacitor structure may include additional electrode pairs in additional metallization layers below the second metallization layer to increase the capacitance per area and/or capacitance density. Each electrode of an electrode pair includes a plurality of electrode fingers extending longitudinally in a spaced-apart, parallel relationship, such as in a comb-like structure. In some embodiments, at least some of the electrode fingers are attached to an electrode bus. The electrode pair of the first metallization layer can be coupled to first and second lines of a coupled line, where each line has a dynamic electrical potential.

In one embodiment, the electrode includes electrode fingers extending generally perpendicularly away from an electrode bus. In another embodiment, the electrode includes a combination of electrode fingers that are attached to the electrode bus as well as electrode fingers that are isolated with respect to the electrode bus. That is, isolated electrode fingers are not directly connected to the electrode bus. The isolated electrode fingers may be interleaved with the attached electrode fingers in a comb-like structure. For example, the isolated electrode fingers are interspersed between attached electrode fingers in an alternating sequence. In one embodiment, an electrode pair has first electrode fingers of a first electrode interleaved with second electrode fingers of a second electrode. For example, the electrode buses extend along opposite sides of the capacitor structure in a given metallization layer. The electrode fingers extend from each electrode bus towards the opposite electrode bus in an interleaved arrangement. In another embodiment, the electrode fingers extend in opposite directions away from respective electrode buses aligned along an imaginary medial plane that extends vertically and is generally centered on the electrode structure.

In various embodiments, electrode fingers of one electrical potential, whether attached or isolated, may be arranged adjacent to electrode fingers of a different electrical potential for a capacitance effect. The potential of such adjacent electrode fingers can be selected so that induced magnetic fields are oriented in opposite directions due to current flow in opposite directions. As a result, the adjacent electrode fingers exhibit at least partial inductance cancellation. Capacitor structures in accordance with the present disclosure are configured for at least some vertical inductance cancellation due to current flowing in opposite directions for vertically adjacent electrode fingers. For example, one electrode finger located in the second metallization layer has a different electrical potential and opposite current flow compared to another electrode finger in the first metallization vertically above. The different electrical potential results in capacitance; the opposite current flow results in inductance cancellation. The amount of inductance cancellation is affected by the magnitude of current flow in each electrode finger, the distance between electrode fingers, and other considerations.

Various embodiments of the capacitor structures of the present disclosure can be part of a differential circuit. For example, capacitors presented in the present disclosure can be used in differential circuits where a differential mode excitation can propagate from one end of a coupled line (containing at least two lines, i.e. a first and a second line) to the other end of the coupled line. In a model of such a capacitor-loaded coupled line, the capacitor built by the fingers of the capacitor structure can be modeled by an RLC circuit. Some models for the capacitor built by these fingers are not limited to the capacitor-loaded coupled line, but are valid for other finger capacitors not using the coupled line. The resistance scaling of an RLC circuit of the present disclosure can be applied to lateral or vertical finger-to-finger capacitors in semiconductor technology. In another example, first and second lines of a coupled line of the capacitor structure are connected to a transformer and to a differential FET. The transformer can be a high-k coupling type or a low-k coupling type transformer for increased bandwidth. In other embodiments, the capacitor can be coupled to a coil to form an inductor-capacitor (LC) matching circuit. In yet other embodiments, capacitors of the present disclosure can be integrated into different semiconductor technologies, such as planar bulk complimentary MOSFET (CMOS) devices, FinFET CMOS devices, semiconductor on insulator devices (SOI), and devices of gallium arsenide (GaAs), indium phosphide (InP), gallium nitride (GaN), and silicon carbide (SiC), to name a few examples. Capacitors of the present disclosure can also be integrated into packaging technologies such as embedded wafer level ball grid array (e-WLB).

General Overview

A capacitor can be implemented in an integrated circuit (IC) for radio frequency (RF) and other applications. The capacitor may be part of a resistor-inductor-capacitor (RLC) circuit), a resistor capacitor (RC) circuit, an inductor-capacitor (LC) circuit, or a transformer circuit, to stabilize voltages, or act as a DC blocker, to name a few examples. In communications, for example, it is desirable in some cases for a capacitor to have a high resonant frequency, a high capacitance density, and a high value for the quality factor (Q-factor). At the same time, it may also be desirable for the capacitor to be highly symmetrical and have low parasitic capacitance. Further, it is desirable for capacitors to have low process variation supported particularly by using thicker metal layers compared to the thinner metal layers used for digital circuits, and which can be found in the upper layers of the metallization stack of the semiconductor technology. For a given overall size of a capacitor, the capacitance can be increased by utilizing multiple thin layers, but with the penalty of increased parasitic capacitance towards the substrate and higher finger resistance. The increased resistance negatively affects the Q-factor of the capacitor. Additionally, capacitor design is complicated by topology requirements since lines of a coupled line in an integrated circuit are generally spaced apart from 1-10 µm, for example. In general, the resonant frequency of the capacitor affects the maximum usable frequency of the device. For example, the resonant frequency of the capacitor in practice should be at least 2-3 times the operating frequency. An operating frequency for millimeter wave communications may be on the order of 24-100 GHz. The resonant frequency can be reduced by inductance in the capacitor structure. Many challenges exist in implementing a capacitor in an integrated circuit.

To this end, the present disclosure is directed to capacitor structures in integrated circuits, such as capacitors suitable for high-frequency applications. For example, a capacitor structure according to an embodiment of the present disclosure may be configured as a comb capacitor, a horizontal parallel plate capacitor, an interleaved finger capacitor, or combinations of these configurations. In some embodiments, a capacitor device employs at least partial vertical inductance cancellation for favorable performance at high frequencies. In some configurations, the vertical inductance cancellation can approach near total cancellation between some or all layers. In some embodiments, a capacitor device also exhibits horizontal capacitance and horizontal inductance cancellation, such as between adjacent electrode fingers. In some embodiments, the capacitor exhibits both horizontal capacitance and vertical capacitance in addition to horizontal inductance cancellation and vertical inductance cancellation. Some capacitor structures according to some embodiments of the present disclosure exhibit a high capacitance density, a high resonant frequency, and a high value for quality factor (Q-factor). Additionally, some embodiments have high symmetry and high capacitance density with low inductance. Additionally, some embodiments feature high symmetry, low capacitance variation, high resonance frequency and high quality factor.

In accordance with some embodiments of the present disclosure, a capacitor structure includes a first metallization layer with first and second electrodes, each of which has electrode fingers. A second metallization layer vertically below the first metallization layer includes a third electrode and a fourth electrode, each of which has electrode fingers. The capacitor structure is configured to exhibit at least partial vertical inductance cancellation when the first electrode and second electrode have different electrical potentials. The capacitor structure can be configured to also exhibit horizontal inductance cancellation between adjacent electrode fingers.

In one embodiment, the capacitor structure is configured with interdigitated fingers. For example, a first metallization layer includes first and second electrodes. A first electrode has first electrode fingers extending in a first direction from a first bus in a spaced-apart parallel relationship. The second electrode has second electrode fingers extending in a second direction from a second bus in a spaced-apart parallel relationship, where the second direction is opposite the first direction. The first bus is spaced from and on an opposite side of the electrode pair from the second bus with the first electrode fingers and the second electrode fingers extending between the busses in an interdigitated relationship. A second metallization layer vertically below the first metallization layer includes a third electrode and a fourth electrode. The third electrode has third electrode fingers extending in the first direction from a third bus (e.g., in a parallel, spaced-apart relationship), where each of the third electrode fingers is positioned vertically below (e.g., aligned with) and corresponds to one of the first electrode fingers. The fourth electrode has fourth electrode fingers extending in the second direction from a fourth bus (e.g., in a parallel, spaced-apart relationship), where each of the fourth electrode fingers is positioned vertically below (e.g., aligned with) and corresponds to one of the second electrode fingers. The fourth electrode fingers are interdigitated with the third electrode fingers. The third bus is electrically connected to the first bus and the fourth bus is electrically connected to the second bus.

In some embodiments, a first line of a coupled line is electrically connected to a middle portion of the first electrode fingers and a second line of the coupled line electrically connected to a middle portion of the second electrode fingers. When the first line has a first electrical potential and the second line has a second electrical potential different from the first electrical potential, the first and second electrode fingers exhibit horizontal inductance cancellation. Specifically, inductance of the first fingers at least partially cancels inductance of the second fingers. Similarly, inductance of the fourth electrode at least partially cancels inductance of the first electrode and inductance of the third electrode at least partially cancels inductance of the second electrode. Thus, the capacitor structure exhibits both horizontal and vertical capacitance as well as horizontal and vertical inductance cancellation. Additional metallization layers may be utilized to increase the capacitance density.

In another embodiment, the capacitor structure is configured for vertical capacitance and vertical inductance cancellation. For example, the electrodes of each electrode pair have a comb-like structure with electrode busses generally aligned on opposite sides of a medial plane and with electrode fingers extending from the bus in a direction away from the medial plane.

An example of one such capacitor structure has a first electrode pair in a first metallization layer, where the first electrode has a first bus with first electrode fingers connected to and extending in a first direction away from the first bus (e.g., in a parallel, spaced-apart relationship). The second electrode has a second bus extending along and spaced from the first bus. A plurality of second electrode fingers are connected to and extend away from the second bus in a second direction opposite the first direction (e.g., in a parallel, spaced-apart relationship).

A second electrode pair has third and fourth electrodes in a second metallization layer positioned vertically below the first metallization layer. The third electrode has a third bus with third electrode fingers connected to the third bus and extending in the first direction away from the third bus (e.g., in a parallel, spaced-apart relationship). Each of the third electrode fingers is aligned below and corresponds to one of the first electrode fingers. The fourth electrode has a fourth bus with fourth electrode fingers connected to the fourth bus and extending in the second direction away from the fourth bus (e.g., in a parallel spaced-apart relationship). The fourth bus extends along and is spaced from the third bus, and the each of the fourth electrode fingers is positioned below and corresponds to one of the second electrode fingers. The third bus is electrically connected to the second bus and the fourth bus is electrically connected to the first bus.

In such a configuration, a first line of a coupled line can be electrically connected to the first bus and a second line of the coupled line can be electrically connected to the second bus. When the first line has a first electrical potential and the second line has a second electrical potential different from the first potential, inductance in the first electrode fingers at least partially cancels inductance in the third electrode fingers and inductance in the second electrode fingers at least partially cancels inductance in the fourth electrode fingers. Here, "different potential" means one of the line of the coupled line has a dynamically increasing potential and the second line of the coupled line has a dynamically decreasing potential.

In another example, the capacitor structure includes isolated first fingers interspersed with the first electrode fingers. An end portion adjacent the first bus of each of the isolated first fingers is electrically connected to the first line of the coupled line vertically above it. Isolated second fingers are interspersed with the second electrode fingers, where an end portion adjacent the second bus of each of the isolated second electrode fingers is electrically connected to the second line of the coupled line vertically above it. Thus, the isolated electrode fingers are coupled to a line of the coupled line that is different from the adjacent electrode fingers in a given electrode. The third and fourth electrodes similarly may include isolated third fingers and isolated fourth fingers interspersed with the third electrode fingers and the fourth electrode fingers, respectively. In some such configurations, the isolated electrode fingers are coupled to the opposite line of the coupled line of the adjacent electrode fingers attached to the electrode bus. This arrangement results in each electrode having adjacent electrode fingers of different electrical potential. Additionally, vertically aligned electrode fingers in different metallization layers also have different electrical potentials. Thus, the capacitor structure exhibits both horizontal and vertical capacitance as well as horizontal and vertical inductance cancellation.

Capacitor structures in accordance with the present disclosure can be simulated with a model. One feature of a model for a capacitor-loaded coupled line structure is four terminals, which refer to the four ends of the coupled line consisting of a first line and a second line. One further terminal may be available for the reference node where the parasitic capacitances of the capacitor-loaded coupled line structure couples. In one simulation, the model for capacitor-loaded coupled line structure contains a capacitor model that simulates capacitance between electrode fingers having a finger length L. The capacitor model includes at least one resistor-capacitor series circuit in which a resistance of the resistor increases with decreasing finger length L for at least some values of the finger length L. The resistance of a conductor finger increases with finger length L due to the increasing resistance of the inner part of the metallization with the length of the finger (sometimes referred to as lateral resistance component along finger length). Due to the liner material surrounding or covering the inner metallization, there can be a second resistance component orthogonal to the direction along the finger length. This resistance increases with a reduced metal surface area cross-section, i.e. when the finger length L is reduced (sometimes referred to as the vertical or orthogonal resistance component with respect to the direction along the finger length). Additionally, there can be constant resistance components which do not scale with the finger length due to interconnects outside of the fingers. The sum of these components can lead to an increasing resistance with increasing finger length for long fingers, an increasing resistance with decreasing finger length for short finger length, and a constant or nearly constant resistance vs. finger length for an intermediate finger length. For short finger length, the derivative of resistance R vs. finger length L, i.e. $dR/dL$ can be negative while it can be positive for long fingers. Accordingly, the resistance vs. finger length may go through a minimum value. If the scaling of the finger length of the capacitor is limited, for example, then the minimum may not be detected and the resistance decreases for longer finger length only. The model for the capacitor loaded coupled line simulates a first line of the coupled line by a first resistive element and a first inductive element, where the first line has a first terminal and a second terminal. The model simulates a second line of the coupled line by a second resistive element and a second inductive element, where the second line has a third terminal and a fourth terminal. The model may further simulate the mutual inductance between the first and second line of the coupled line. The model may further simulate the mutual inductance between the first and the second line towards closed conductor loops within the capacitor structure or unattached (i.e. not electrically coupled to the capacitor) closed conductor loops. The closed loops are modeled by a closed loop circuit of an inductor and resistor.

As will be appreciated, the model can be embodied in a number of tangible forms. For instance, in some embodiments, the model is effectively captured in a computer program product that includes one or more non-transitory machine-readable mediums encoded with instructions that, when executed by one or more processors, cause a process to be carried out for simulating an integrated circuit as variously provided herein. In other example embodiments, the model is effectively captured in a data structure encoded on one or more non-transitory machine-readable mediums that, when accessed by one or more processors, causes a process to be carried out for simulating an integrated circuit as variously provided herein. To this end, and as will be appreciated, the model can be captured in any combination of hardware and software so as to provide a physical machine or apparatus programmed or otherwise configured to simulate an integrated circuit.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate, for example, a middle portion of interdigitated electrode fingers in a first metallization layer coupled to a coupled line, where electrodes in a second metallization layer below the first metallization layer are coupled to the coupled line so as to provide vertical inductance cancellation. Such tools may also indicate electrode pairs in at least two metallization layers with electrode fingers arranged and coupled in such a way as to provide vertical capacitance and vertical inductance cancellation. In some embodiments, the techniques described herein may be detected based on the benefits derived from their use, which includes capacitor structures with high resonant frequencies and reduced inductance.

Example Structures

Figure 2:
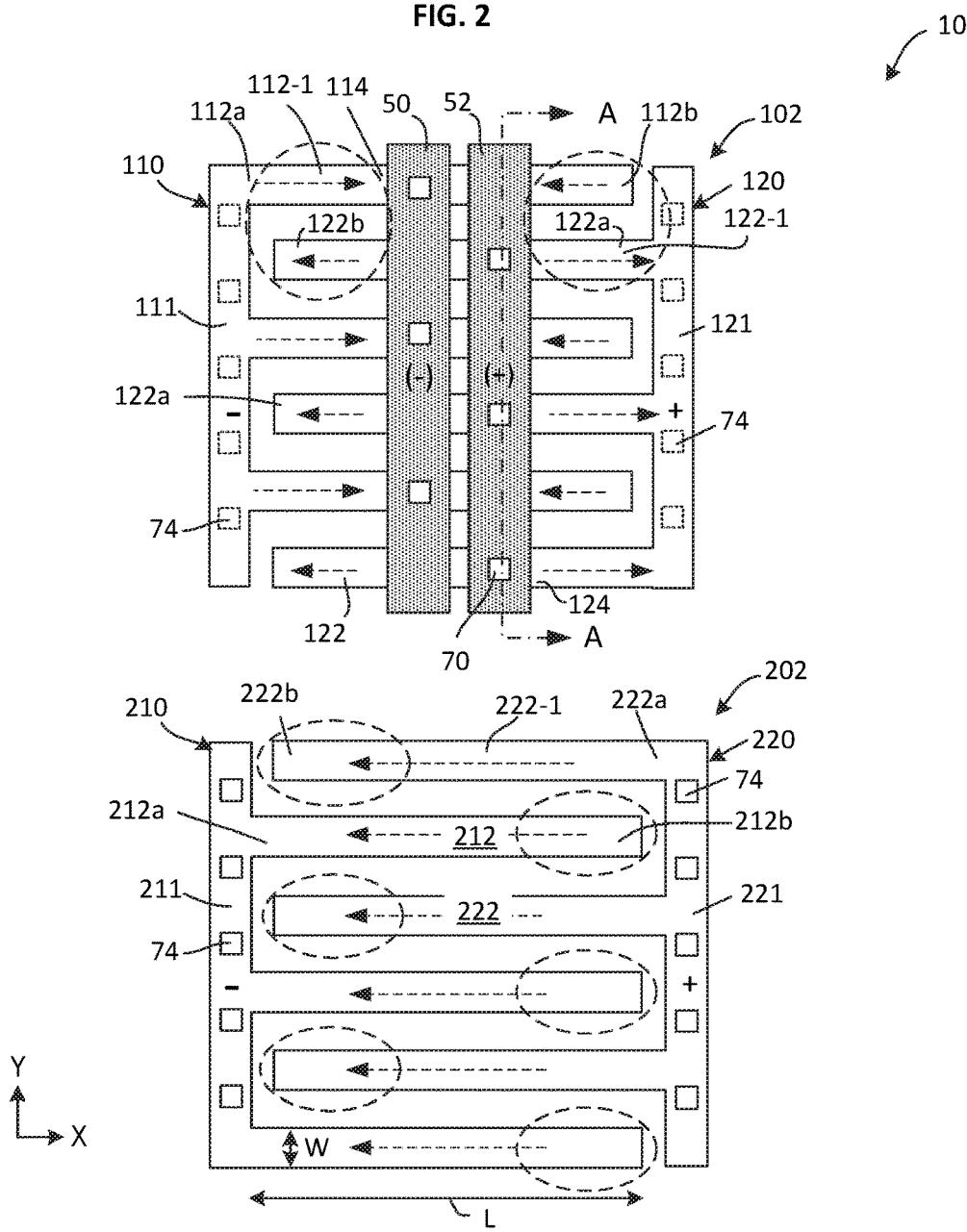
FIG. 2 is a top plan view showing the first and second metallization layers of the capacitor shown in FIG. 1, in accordance with an embodiment of the present disclosure.
Figure 3:
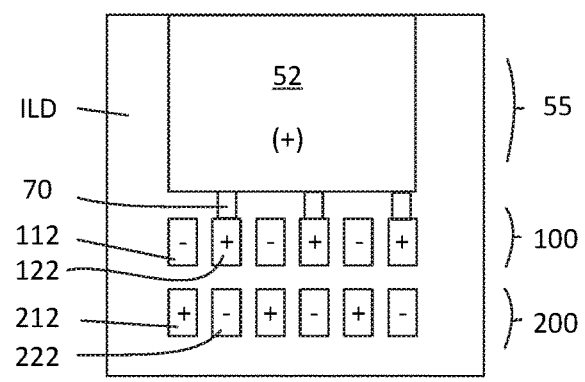
FIG. 3 is a cross-sectional view of the capacitor structure of FIG. 1 as taken along line A-A of FIG. 2.
Figure 4:
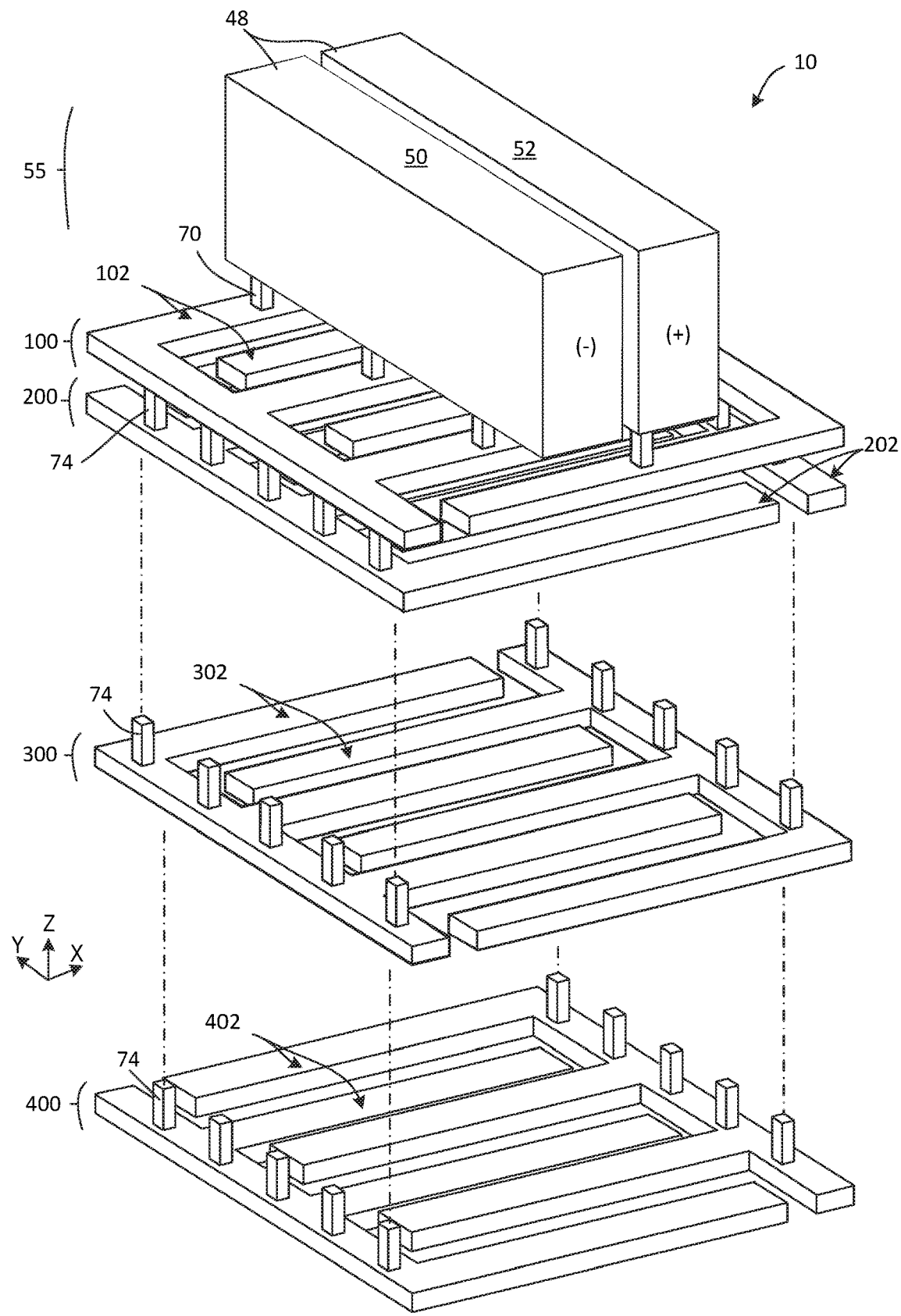
FIG. 4 is a perspective, partially exploded view of a capacitor structure that includes first, second, third, and fourth electrode pairs in respective metallization layers, in accordance with an embodiment of the present disclosure.

FIGS. 1-4 illustrate views of a capacitor structure 10 in accordance with an embodiment of the present disclosure. In some embodiments, capacitor structure 10 is a multi-layer structure that can be formed in metallization layers of an integrated circuit. For example, electrodes and other structures formed in a given metallization layer are vertically spaced by an interlayer dielectric (ILD) from structures in an adjacent metallization layer vertically above or below the layer. FIG. 1 illustrates a perspective, exploded view of the capacitor structure 10; FIG. 2 illustrates top plan views of structures in various metallization layers; FIG. 3 illustrates a cross-sectional view taken along lines A-A of FIG. 2; and FIG. 4 illustrates a perspective view showing the structures of FIG. 1 assembled in addition to optional electrode structures in additional metallization layers.

In one embodiment, capacitor structure 10 includes a first electrode pair 102 formed in a first metallization layer 100 and a second electrode pair 202 formed in a second metallization layer 200, where the second metallization layer 200 is vertically below the first metallization layer 100. The first electrode pair 102 includes a first electrode 110 and a second electrode 120 in a horizontal plane of the first metallization layer. The first electrode 110 has two or more first electrode fingers 112 extending longitudinally in a spaced-apart, parallel relationship. The second electrode 120 has two or more second electrode fingers 122 extending longitudinally in a spaced-apart, parallel relationship. The first electrode fingers 112 and the second electrode fingers 122 are generally coplanar and parallel to each other, where the first electrode fingers 112 and the second electrode fingers 122 are horizontally spaced in an interdigitated arrangement. That is, at least a portion of each first electrode finger 112 extends longitudinally along and adjacent to a second electrode finger 122. For example, a majority portion or more of each first electrode finger 112 extends along a second electrode finger 122 in an alternating, spaced-apart fashion (e.g., first electrode finger, second electrode finger, first electrode finger, second electrode finger . . . ). Although FIGS. 1-4 illustrate three first electrode fingers 112 and three second electrode fingers 122, the first electrode 110 and second electrode 120 may have any number of electrode fingers, including one, two, three, tens, hundreds, or more. In some embodiments, each first electrode finger 112 corresponds to one second electrode finger 122, where the number of first electrode fingers 112 equals the number of second electrode fingers 122. In other embodiments, the number of first electrode fingers 112 may not be equal to the number of second electrode fingers 122.

In some embodiments, the first electrode fingers 112 are connected at one end to and extend from a first electrode bus 111. For example, the first electrode bus 111 extends perpendicularly to the first electrode fingers 112 and connects to a proximal end of each first electrode finger 112. Similarly, second electrode fingers 122 can connect at a distal end to a second electrode bus 121 that extends perpendicularly to the second electrode fingers 122. In such embodiments, the first electrode bus 111 and the second electrode bus 121 extend in parallel at opposite sides of the first electrode pair 102 with interdigitated first and second electrode fingers 112, 122 between the first and second electrode buses 111, 121.

In some embodiments, first and second lines 50, 52 of a coupled line 48 are formed in a metallization layer 55 above the first metallization layer 100. The first electrode pair 102 can be electrically connected to the respective first and second lines 50, 52. For example, first electrode 110 is electrically connected to the first line 50 and the second electrode 120 is electrically connected to the second line 52, where the first line 50 has a first potential (e.g., (−)) and the second line 52 has a second potential different from the first potential (e.g., (+)). In one example embodiment, a first middle portion 114 of the first electrode fingers 112 is coupled to the first line 50 and a second middle portion 124 of the second electrode fingers 122 is coupled to the second line 52. The first middle portion 114 and/or second middle portion 124 may be centered along the length L of a given electrode finger. In some embodiments, the first middle portion 114 and/or second middle portion 124 are not exactly centered, but instead split the respective electrode finger into majority and minority portions with a ratio of about 55:45, 60:40, 65:35, or 70:30 to name a few examples. In other embodiments, the first line 50 is electrically connected to the first electrode fingers 112 at a location between the first electrode bus 111 and the distal end 112b (i.e., the end adjacent the second electrode bus 121). Similarly, the second line 52 can be electrically connected to the second electrode fingers 122 at a location between the second electrode bus 121 and the proximal end 122a of the second electrode finger(s) 122 (i.e., the end adjacent first electrode bus 111). For a differential mode excitation of the coupled line, the inductance of the first and second line is canceled by the mutual inductance between these lines. The smaller the spacing between the first and second line, the higher the inductance cancellation. In some embodiments the spacing maybe 0.3 um, or 0.4 um, or 0.5 um, or 0.6 um, or 0.7 um, or 0.8 um, or 0.9 um, or 1-2 um or even larger. For a common mode excitation, the inductance of the lines will be enhanced due the mutual inductance between the first and second line of the coupled line. The magnetic coupling of the first and second line of the coupled line to the loops inside the capacitor structure 10 (as denoted, for example, in FIG. 14C) in common mode excitation will lower the inductance of the two lines. In differential mode excitation, the magnetic fields of the first line and second line cancel each other at least in part. In this case a small magnetic coupling towards the loops inside the capacitor structure exists and the inductance of the first and second line is not or very little affected by the loops. A general excitation of the coupled line can be decomposed into differential mode and common mode excitations, as will be appreciated.

The first electrode pair 102 can be electrically connected to the first and second lines 50, 52 by via plugs 70 extending through the ILD or other suitable structure, as will be appreciated. For example, via plugs 70 of a conductive material are formed in contact with a top surface of the first middle portion 114 of the first electrode fingers 112 and extend vertically to contact the first line 50. Similarly, via plugs 70 are formed in contact with a top surface of the second middle portion 124 of the second electrode fingers 122 and extend vertically to contact the second line 52.

The second electrode pair 202 includes a third electrode 210 and a fourth electrode 220. In one embodiment, the third electrode 210 has two or more third electrode fingers 212 extending longitudinally in a spaced-apart and parallel relationship. The fourth electrode 220 has two or more fourth electrode fingers 222 extending longitudinally in a spaced-apart and parallel relationship. The third electrode fingers 212 and the fourth electrode fingers 222 are generally coplanar and parallel to each other, where the third electrode fingers 212 and the fourth electrode fingers 222 are horizontally spaced in an interdigitated arrangement. That is, at least a portion of each third electrode finger 212 extends longitudinally along and adjacent to one or two fourth electrode fingers 222. For example, a majority portion or more of each third electrode finger 212 extends along a fourth electrode finger 222 in an alternating, spaced-apart fashion (e.g., third electrode finger, fourth electrode finger, third electrode finger, fourth electrode finger . . . ). Accordingly, the third electrode fingers 212 are positioned between fourth electrode fingers 222 and vice versa, except where the third electrode finger 212 or fourth electrode finger 222 is the first or last finger of the interdigitated fingers of the electrode pair 202 as the case may be. Although FIGS. 1-4 illustrate three third electrode fingers 212 and three fourth electrode fingers 222, the third electrode 210 and fourth electrode 220 may have any number of electrode fingers, including one, two, three, tens, hundreds, or more. In some embodiments, each third electrode finger 212 corresponds to one fourth electrode finger 222, where the number of third electrode fingers 212 equals the number of fourth electrode fingers 222.

In some embodiments, the third electrode fingers 212 are connected at one end to and extend from a third electrode bus 211. For example, the third electrode bus 211 extends perpendicularly to the third electrode fingers 212 and connects to a proximal end 212a of each third electrode finger 212. Similarly, fourth electrode fingers 222 can connect at a distal end 222b to a fourth electrode bus 221 that extends perpendicularly to the fourth electrode fingers 222. In such embodiments, the third electrode bus 211 and the fourth electrode bus 221 extend in parallel at opposite sides of the second electrode pair 202 with interdigitated third and fourth electrode fingers 212, 222 between the third and fourth electrode buses 211, 221.

The second electrode pair 202 can be electrically connected to the first electrode pair 102, such as with conductive via plugs 74, as will be appreciated. For example, the third electrode bus 211 is electrically connected to the first electrode bus 111 above it, and the fourth electrode bus 221 is electrically connected to the second electrode bus 121 above it. In some such embodiments as shown in FIG. 1, for example, third electrode fingers 212 are coupled to the same potential as the first electrode fingers (e.g., a first potential (−)), but are positioned below (e.g., aligned below) second electrode fingers of the second potential. Similarly, fourth electrode fingers 222 are coupled to the same potential as the second electrode fingers (e.g., a second potential (+)), but are positioned below (e.g., aligned below) the first electrode fingers 112 of the first potential.

When electrode fingers of different potentials are positioned sufficiently close together in the same plane or aligned vertically, the fingers exhibit capacitance and inductance; however, being coplanar or vertically aligned is not required for capacitance or inductance to occur, as will be appreciated. In an example embodiment shown in FIG. 1, each third electrode finger 212 is positioned vertically below and corresponds to (e.g., aligns with) one of the second electrode fingers 122 of the second electrode 120. Similarly, each fourth electrode finger 222 is positioned vertically below and corresponds to (e.g., aligns with) one of the first electrode fingers 112 of the first electrode 110. In some such embodiments, the third electrode bus 211 is positioned below and corresponds to (e.g., aligns with) the first electrode bus 111, and the fourth electrode bus 221 is positioned vertically below and corresponds to (e.g., aligns with) the second electrode bus 121. In other embodiments, each third electrode finger 212 is positioned vertically below and corresponds to one of the first electrode fingers 112 and each fourth electrode finger 222 is positioned vertically below and corresponds to one of the second electrode fingers 122 of the second electrode 120.

In some embodiments, electrodes of the second electrode pair 202 have a similar or identical geometry compared to electrodes of the first electrode pair 102. Similarly, electrodes of a given electrode pair 102, 202 may be similar or identical in geometry with respect to one another except, for example, for being rotated about an axis or being a mirror image of the other electrode. It may be desirable in some applications for electrode pairs, individual electrodes, and/or portions of electrodes (e.g., fingers) to be highly symmetrical. For example, a given electrode finger may have a finger length L, width W, electrode area A (e.g., in the X-Y plane), thickness T, or other dimension that is similar to or identical to that of a horizontally adjacent or vertically adjacent electrode finger. In another example, a portion of one electrode finger has the same area as a portion of another electrode finger that is directly above or below it. In other embodiments, however, vertically adjacent or horizontally adjacent fingers have one or more unequal dimension. other embodiments, electrodes may be substantially identical, such as having the same number of electrode fingers, same finger spacing, and/or same finger width W; however, the electrodes may differ in the dimensions of the electrode bus, dimensions or location of extension tabs on the electrode bus, the finger length, the metallization thickness, and/or the spacing between adjacent electrode fingers, for example. For example, in some situations, each metallization layer may have specific minimum finger width and minimum finger spacing that differs from layer to layer, as will be appreciated. In some such cases, the width of electrode fingers and spacing between adjacent electrode fingers can be selected to increase the capacitance density. Decreasing the spacing between fingers will increase the capacitance density, while increasing the finger width will lower the resistance.

In one example embodiment shown in FIG. 1, the first electrode pair 102 is identical in geometry to the second electrode pair 202 except that the first electrode pair 102 is rotated 180° about the X-axis or Y-axis compared to the second electrode pair 202. Similarly, the first electrode 110 may have the same geometry as the second electrode 120, except for the first electrode 110 being rotated 180° about the Z-axis compared to the second electrode 120. Similarly, again, the third electrode 210 may have the same geometry as the fourth electrode 220 except for the third electrode 210 being rotated 180° about the Z-axis compared to the fourth electrode 220.

Referring now to FIG. 2, plan views separately illustrate the first electrode pair 102 and the second electrode pair 202. For reference, first and second lines 50, 52 of the coupled line 48 are shown on top of the first electrode pair 102. When the capacitor structure 10 is arranged as shown in FIG. 1 and as discussed above, the first electrode pair 102 exhibits horizontal capacitance between adjacent fingers because the adjacent fingers have different electrical potentials. For example, when the first electrode 110 has a negative potential and the second electrode 120 has a positive potential, the interdigitated fingers alternate negative, positive, negative, positive, etc. Due to being coupled at a middle portion 114, 124 to respective first and second lines 50, 52 of the coupled line 48, electrical current may flow towards or away from the point of connection. Opposite directions of current flow (i.e., anti-parallel currents) result in opposite directions for the resulting induced magnetic fields. When the current flows in opposite directions in adjacent electrode fingers, the electrode pair exhibits inductance cancellation between adjacent electrode fingers, such as between a first electrode finger 112 and an adjacent second electrode finger 122. The inductance cancellation may be full or partial cancellation, but may result from opposite induced magnetic fields along substantially the entire length L of the electrode fingers, in accordance with some embodiments.

For example, when a first electrode finger 112 is coupled at the first middle portion 114 to a negative potential (e.g., first line 50 (−)) the current flows towards the first middle portion 114, inward from both the proximal end 112a (connected to bus 111) and the distal end 112b of the first electrode finger 112. Similarly, when a second electrode finger 122 is coupled at the second middle portion 124 to a positive potential (e.g., second line 52 (+)), the current flows away from the second middle portion 124, outward towards the distal end 122b and proximal end 122a (connected to bus 121) of the second electrode finger 122. As a result, the inductance of adjacent portions of first electrode fingers 112 and second electrode fingers 122 is partially or completely canceled. The extent of inductance cancellation depends at least in part on the alignment of the electrode fingers, electrode geometry, length of the electrode finger portion from the point of coupling to the potential to the end, spacing between the electrode fingers, and other factors, as will be appreciated. In other embodiments, via plugs 70 connecting the coupled line 48 to the first electrode pair 110 need not be centered along or connected to the middle portions of the first fingers 112 and second electrode fingers 122. Rather, the first line 50 and second line 52 can be electrically connected by via plugs 70 to the first electrode fingers 112 and the second electrode fingers 122, respectively, at a location between the first electrode bus 111 and the second electrode bus 121. Connecting the coupled line to the first and second electrode fingers 112, 122 between the busses may apply even when the first and second lines 50, 52 are positioned over or have a size that extends over the first and second electrode busses 111, 121. In one example, the opposed inside faces of the first line 50 and second line 52 are both vertically aligned between the first electrode bus 111 and the second electrode bus 121 so that via plugs 70 can extend vertically upward from the electrode fingers 112, 122 to the coupled line 48, rather than from the electrode busses 111, 121.

In FIG. 2, regions of electrode fingers circled in broken lines exhibit inductance cancellation with a horizontally or vertically adjacent electrode finger. For example, the proximal end portion 112a of first electrode finger 112-1 and the adjacent distal end portion 122b of second electrode finger 122-1 are circled together, indicating horizontal inductance cancellation between the circled portions of these electrode fingers. Similarly, the distal end portion 112b of first electrode finger 112-1 and the proximal end portion 122a of second electrode finger 122-1 are circled together, indicating horizontal inductance cancellation between these end portions of the electrode fingers. In the lower portion of FIG. 2, the proximal end portions 222a of fourth electrode fingers 222 and the distal end portions 212b of third electrode fingers 212 are also circled separately. These portions of the third and fourth electrode fingers 212, 222 exhibit vertical inductance cancellation with portions of the second and first electrode fingers 122, 112 positioned vertically above them, respectively.

FIG. 3 illustrates a cross-sectional view of the capacitor structure 10 of FIG. 1 as taken along line A-A through second line 52 (+) as shown in FIG. 2. Second line 52 is formed in metallization layer 55; first and second electrode fingers 112, 122 are formed in first metallization layer 100; and third and fourth electrode fingers 212, 222 are formed in second metallization layer 200. Regions between these structures can be filled with interlayer dielectric (ILD), as will be appreciated. Example positive and negative potentials of each electrode finger are shown with a (+) or (−), respectively. Second line 52 has a positive potential and is coupled to the second finger electrodes 122 by via plugs 70. In the horizontal direction, first electrode fingers 112 alternate with second electrode fingers 122. First finger electrodes 112 have a negative potential (−) and are vertically aligned over third electrode fingers 212 of positive potential (+). Second electrode fingers 122 have a positive potential (+) and are aligned over third electrode fingers 212 of negative potential (−).

In the example arrangement of electrode fingers and electrical potentials shown in FIGS. 1-3, capacitor structure 10 is configured to exhibit horizontal capacitance between adjacent electrode fingers in both the first metallization layer 100 and the second metallization layer 200. Capacitor structure 10 also exhibits vertical capacitance between vertically aligned electrode fingers of the first metallization layer 100 and second metallization layer 200. In addition, capacitor structure 10 is configured to exhibit near full horizontal inductance cancellation between adjacent first and second electrode fingers 112, 122. Capacitor structure 10 also exhibits partial vertical inductance cancellation between vertically aligned portions of first and fourth electrode fingers 112, 222 as well as portions of the second and third electrode fingers 122, 212.

Referring now to FIG. 4, a perspective, partially exploded view shows an example of the capacitor structure 10 of FIG. 1 in addition to electrode pairs 302, 402 formed in a third metallization layer 300 and a fourth metallization layer 400, respectively. Metallization layer 55 and the first and second metallization layers 100, 200 are an example of an assembled capacitor structure 10. With the exception of the location of via plugs 70, the third electrode pair 302 of the third metallization layer 300 may be structurally identical to that of first electrode pair 102. Similarly, the fourth electrode pair 402 formed in the fourth metallization layer 400 may be structurally identical to second electrode pair 202. That is, the geometry of first electrode pair 102 and the second electrode pair 202 may be the same in each additional electrode pair. Thus, the structure of the first and second electrode pairs 102, 202 may be the same as the structure of the third and fourth electrode pairs 302, 402. By including additional electrode pairs in metallization layers below the second metallization layer, the capacitance per area, i.e. capacitance density can be increased for the capacitor structure 10.

One advantage of the capacitor structure 10 shown in FIGS. 1-4, for example, is high capacitance density, a high resonant frequency, a high Q-factor, and high symmetry. The capacitor structure 10 also has a small capacitance variation due to process variations in the selected thicker metals and larger spacing between neighboring fingers and exhibits low parasitic capacitance. In one embodiment the 3 sigma variation of the capacitance value of the capacitor structure maybe smaller that 15%, or smaller than 10%, or smaller than 7% or smaller than 5% or smaller than 3%. The increased resonant frequency is a result of the inductance cancellation. In some embodiments, the resonant frequency is increased by as much as 40% compared to other capacitor structures. Additionally, some embodiments of the capacitor structure 10 are suitable for use in a differential circuit due to the symmetrical layout and ease of connection to lines 50, 52 of the coupled line 48. Unlike other capacitor structures in which the first and second lines 50, 52 of the coupled line 48 are connected to electrode busses on opposite sides of the electrode pair, the first and second lines 50, 52 can be easily connected to the capacitor structure 10 due to being located in close proximity to one another. In one embodiment, the first and second lines 50, 52 are spaced by 2 μm or less, including 1 μm or less. In some embodiments, each of the first line 50 and second line 52 has a horizontal line width of 10 μm or less.

The capacitor structures 10 in accordance with the present disclosure are suitable for use in high-frequency applications, such as millimeter wave communications having operating frequencies in the range from 20 to 100 GHz, for example. In some example embodiments, metallization layer 55 has a vertical thickness of 1 μm, or 2 μm, or 3 μm, or 4 μm or 5 μm, the electrodes 110, 120 in first metallization layer 100 have a vertical thickness of about 500 nm, or 600 nm, or 700 nm or 800 nm or 900 nm, or 1000 nm or 1200 nm, the electrodes 210, 220 in second metallization layer 200 have a vertical thickness of 50 nm, or 75 nm, or 100 nm, or 150 nm, or 200 nm. Other values are acceptable, as will be appreciated. Via plugs 70 between metallization layer 55 and the first metallization layer 100 have a vertical thickness greater than 2 μm, or 2 μm or less, 1.5 μm or less, 1.0 μm or less, 750 nm or less, or 500 nm or less, and the via plugs 74 between the first metallization layer 100 and the second metallization layer 200 have a vertical thickness from 0.2 to about 0.8 μm. Electrode fingers generally have a length from 2 μm to 100 μm, such as about 50 μm. In some instances, however, the electrode fingers can have a greater length, such as about 1 mm, or other length suitable for a given application. In some embodiments, electrode fingers have a finger width from 350 nm to 700 nm. For example, electrode fingers of the first metallization layer 100 have a finger width W of about 400 nm and spacing between adjacent electrode fingers of about 350-450 nm, such as 400 nm. Electrode fingers in the second metallization layer 200 have a finger width W of about 550-650 nm, such as about 600 nm, and spacing of about 150-250 nm between adjacent electrode fingers, such as about 200 nm. Other dimensions are acceptable, as will be appreciated.

In one particular example suited for a device with 300 fF capacitance, the capacitor structure 10 has a capacitor length of about 28-30 μm, a capacitor width of about 50-55 μm, and a capacitor area of about 1500 μm$^2$. Such embodiments can have a capacitance density of more than 0.220 fF/μm$^2$ and a resonant frequency of about 140 GHz. For example, the capacitor structure 10 is formed in metallization layers M5 and M6.

Another example is a capacitor structure suited for a device with 500 fF capacitance and can be formed in three or more metallization layers, such as metallization layers M4-M6. In one example, the device has a capacitor length of about 22-24 μm, a capacitor width of about 50-55 μm, and a capacitance area of about 1,200 μm$^2$. The device has a capacitance density of 0.45 fF/μm$^2$ and a resonant frequency of about 110 GHz.

Another embodiment has a capacitance area of about 850 μm$^2$, a capacitance density of about 0.60 fF/μm$^2$, and a resonant frequency of about 130 GHz. Yet another embodiment has a capacitance area of 685 μm$^2$, a capacitance density of about 0.80 fF/μm$^2$ and a resonant frequency of about 140 GHz.

Figure 5:
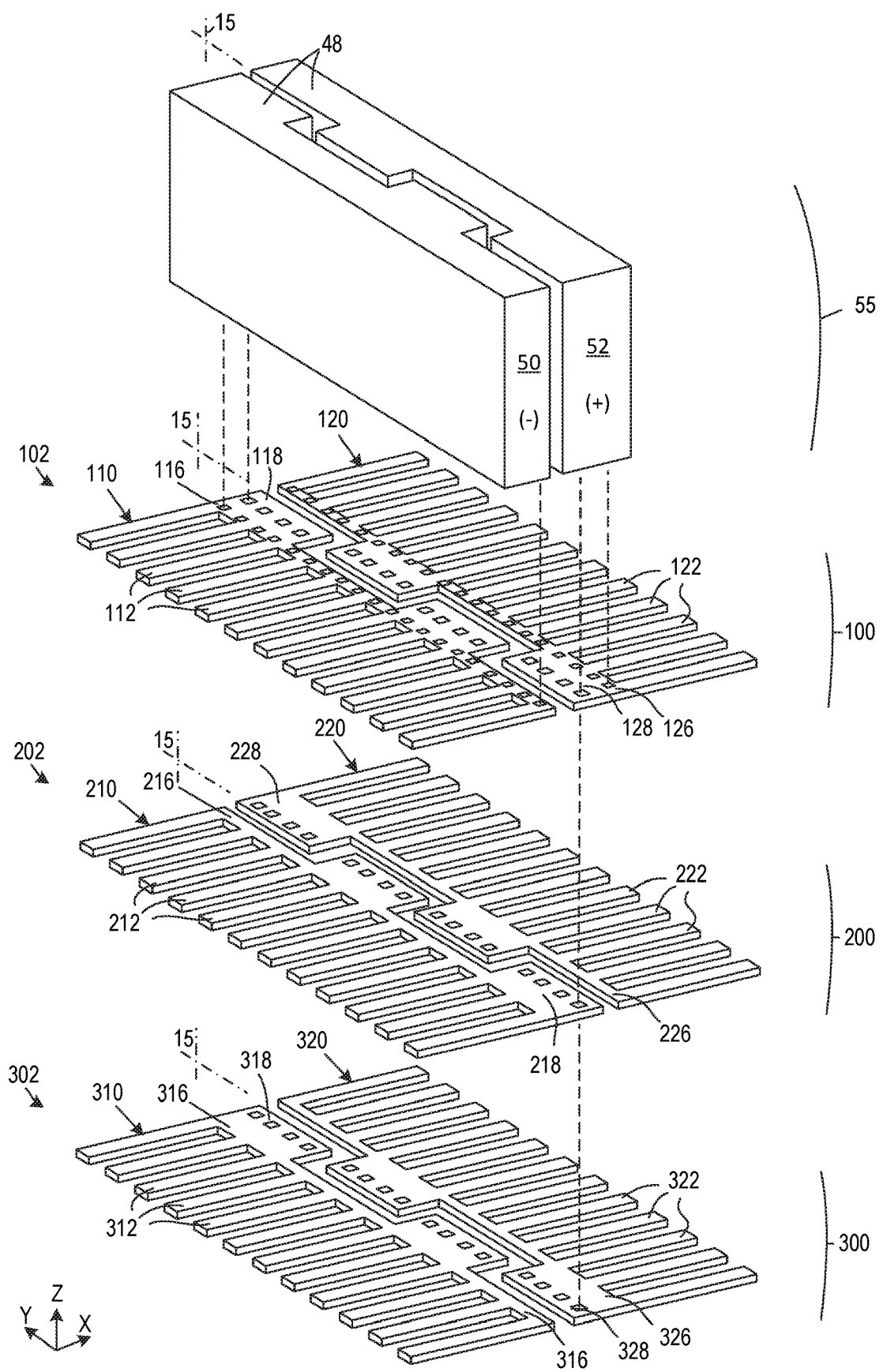
FIG. 5 is a perspective, exploded view of another capacitor structure with first, second, and third metallization layers, where the capacitor structure is configured for vertical inductance cancellation, in accordance with an embodiment of the present disclosure.
Figure 6:
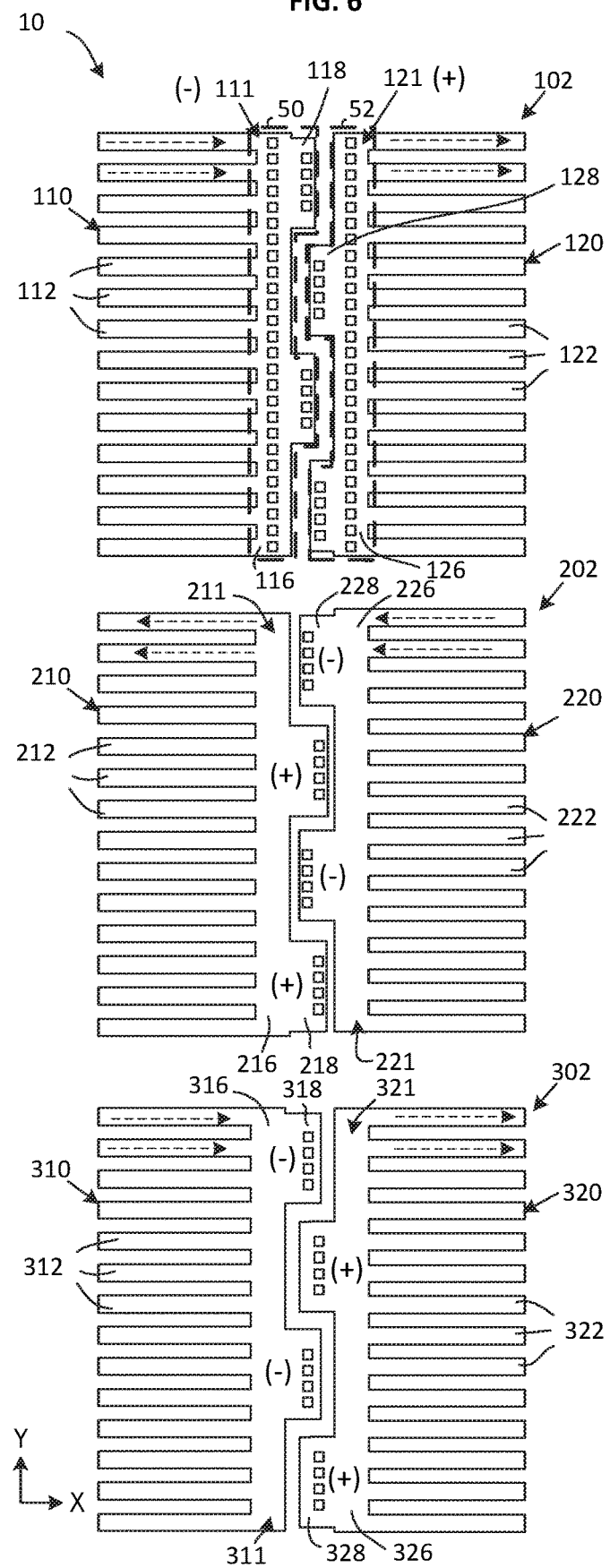
FIG. 6 is a plan view separately showing electrode pairs of the first, second, and third metallization layers of the capacitor structure of FIG. 5, in accordance with an embodiment of the present disclosure.

Referring now to FIGS. 5 and 6, a perspective, exploded view and top plan views show metallization layers of a capacitor structure 10 in accordance with another embodiment of the present disclosure. FIG. 5 shows first and second lines 50, 52 and electrode pairs 102, 202, 302 for first, second, and third metallization layers 100, 200, 300, respectively. FIG. 6 separately illustrates plan views of the electrode pairs 102, 202, 302 of first, second, and third metallization layers, respectively. First and second lines 50, 52 are shown in broken lines in FIG. 6 to illustrate an example position over the first electrode pair 102.

In the embodiment of FIGS. 5-6, the capacitor structure 10 is configured to utilize vertical capacitance coupling and vertical inductance cancellation between electrode pairs. Advantages of such a configuration may include decreased magnetic field, decreased inductance associated with each electrode finger, and/or an increase in resonant frequency. Magnetic coupling can be strongest in the vertical direction, especially for thick metal layers with a close vertical spacing less than 1 μm, effective vertical inductance cancellation can provide a higher resonant frequency compared to other embodiments. The vertical inductance cancellation may be partial or complete, depending on geometry and other factors, as will be appreciated. In some embodiments, the inductance of a given electrode finger is canceled by at least 50%, including at least 60%, at least 70%, at least 80%, and at least 90%. In some embodiments, the inductance cancellation is at least 90%, at least 95%, from 95-99%, or at least 99%. The same levels of inductance cancellation may also be applied to a given electrode or a given electrode pair.

In one example embodiment, the first electrode pair 102 of first metallization layer 100 has a structure that is also found in the second and third electrode pairs 202, 302, except for rotation about the Z-axis in some instances. The structure of the first electrode pair 102 may also be found in additional electrode pairs when present. Although three metallization layers are shown in addition to first and second lines 50, 52, capacitor structure 10 may have two, three, four, five, or more metallization layers that each include an electrode pair. In some embodiments, having four, five, or more metallization layers, for example, the first, third, fifth, and additional odd numbered electrode pairs can be identical in geometry. Similarly, the second, fourth, sixth, and additional even numbered electrode pairs can be identical in geometry. The symmetry of this example embodiment is useful for vertical inductance cancellation and results in favorable performance for high-frequency operation.

In the example embodiment of FIGS. 5-6, the first and third electrode pairs 102, 302 have identical geometry. The second electrode pair 202 differs geometrically from the first and third electrode pairs 102, 302 only by 180° rotation about one of the X-axis, Y-axis, of Z-axis. That is, the second electrode pair 202 is a mirror image of the first electrode pair 102. Additionally, within the first electrode pair 102, the first electrode 110 is geometrically identical to the second electrode 120 except for 180° rotation about the Z-axis. Electrodes within the second and third electrode pairs 202, 302 are similarly identical in geometry except for rotation.

In some embodiments utilizing vertical inductance cancellation, the capacitor structure 10 has at least two plates or electrode pairs in respective metallization layers. It is contemplated that the capacitor structure 10 in some embodiments may provide suitable performance for some applications when including only the first electrode pair 102 and second electrode pair 202. As such, electrodes in metallization layers below the second metallization layer 200 may be optional.

The first electrode pair 102 includes a first electrode 110 and a second electrode 120. The first electrode 110 has a first electrode bus 111 with first electrode fingers 112 connected to and extending in a first direction away from the first electrode bus 111 in a parallel, spaced-apart relationship. The second electrode 120 has a second electrode bus 121 extending along and spaced from the first electrode bus 111. For example, the first electrode bus 111 is on one side of the medial plane 15 and the second electrode bus is on the opposite side of the medial plane 15. Second electrode fingers 122 are connected to and extend in a second direction away from the second bus 121 in a parallel, spaced-apart relationship, where the second direction is opposite the first direction.

The second metallization layer 200 is positioned vertically below the first metallization layer 100 and spaced therefrom by an interlayer dielectric (not shown), as will be appreciated. The second metallization layer 200 includes a second electrode pair 202 that includes a third electrode 210 positioned vertically below the first electrode 110 and a fourth electrode 220 positioned vertically below the second electrode 120. The third electrode 210 has a third electrode bus 211 with third electrode fingers 212 connected thereto and extending in the first direction away from the third electrode bus 211 in a parallel, spaced-apart relationship. In some embodiments, each of the third electrode fingers 212 is aligned below and corresponds to one of the first electrode fingers 112. The fourth electrode 220 has a fourth electrode bus 221 with fourth electrode fingers 222 connected thereto and extending in the second direction away from the fourth electrode bus 221 in a parallel, spaced-apart relationship. The fourth electrode bus 221 extends along and is spaced from the third electrode bus. In some embodiments, the fourth electrode bus 221 is aligned below the second electrode bus 121 and each of the fourth fingers is aligned below and corresponds to one of the second electrode fingers 122.

The first and second electrodes 110, 120 are electrically connected to first and second lines 50, 52, respectively. In one embodiment, for example, copper interconnect may be used to fill vias defined vertically through an interlayer dielectric to electrically connect the first electrode bus 111 to first line 50 and connect the second electrode bus 121 to second line 52. For example, via plugs extend upward from first bus body portion 116 and first connection tab 118 to connect to first line 50. Similarly, via plugs extend upward from second bus body portion 126 and second connection tabs 128 to connect to second line 52. Other metals and connection methods are acceptable, as will be appreciated. Similarly, the third electrode bus 211 can be electrically connected to the second electrode bus 121 and the fourth electrode bus 221 can be electrically connected to the first electrode bus 111. When the first and second lines 50, 52 have dynamically changing potentials, the electrode fingers that are vertically aligned with one another have alternating electrical potentials.

For example, the first, third, and fifth electrodes have a negative electrical potential and the second, fourth, and sixth electrodes have a positive electrical potential. As a result, vertically aligned electrode fingers in vertically adjacent metallization layers exhibit vertical capacitance acting as parallel charged plates. Also, since the charge in one electrode (e.g., the first electrode 110) is opposite to the charge of an electrode below it (e.g., the third electrode 210) the current flows in opposite directions along the respective electrode fingers 112, 212. Accordingly, the induced magnetic fields of the respective electrode fingers cancel each other at least in part. In this embodiment, since adjacent electrode fingers in a given electrode have the same electrical potential with respect to one another, the electrode does not exhibit horizontal capacitance between adjacent fingers. Similarly, since the current also flows in the same direction in adjacent electrode fingers of a given electrode, the electrode also does not exhibit horizontal inductance cancellation between adjacent fingers. As will be appreciated, the amount of inductance cancellation can be affected by the area of the electrode fingers, the magnitude of the electrical potential, the accuracy of the alignment, vertically spacing between the electrode fingers, and other factors.

Electrical connections between electrodes on different metallization layers may be accomplished using metal interconnect that contacts and extends between the electrode busses of vertically aligned electrodes. For example, the first electrode bus 111 includes a first body portion 116 to which the first electrode fingers 112 attach, where the first body portion 116 has a generally linear geometry and is spaced from the medial plane 15. In some embodiments, the first electrode bus 111 also includes one or more connection tabs 118 extending away from the body portion 116 and configured to be electrically connected to a line on the opposite side of the medial plane 15. For example, the first bus body portion 116 is positioned on one side of the medial plane 15 and the second bus body portion 126 is positioned on the opposite side of the medial plane 15. First connection tab(s) 118 extend towards, and in some cases across, the medial plane 15 away from the first electrode fingers 112. Metal interconnects (e.g., copper) extend vertically from the fourth connection tab 228 to the first connection tab 118. For the first electrode pair 102, connection tab(s) 118, 128 optionally can be used to also make electrical connection to the first and second lines 50, 52, respectively. In FIGS. 5-6, squares on the electrodes represent example locations for metal interconnects (i.e., via plugs) that extend upward to the electrode (or other structure) in the metallization layer directly above, as will be appreciated. For example, squares on connection tab 118 represent the location of via plugs that connect to first line 50, while squares on the bus body portion 116 represent the location of via plugs that connect to first line 50. Similarly, squares on the third electrode 210 and fourth electrode 220 represent locations of via plugs that extend upward to connect to the second electrode 120 and first electrode 110, respectively.

The second electrode bus 121 includes a second bus body portion 126. An end of each second electrode finger 122 is connected to the second bus body portion 126. For example, the second bus body portion 126 has a generally linear geometry that extends along and is positioned on an opposite side of medial plane 15 compared to first bus body portion 116. The second electrode fingers 122 extend horizontally away from the medial plane 15. The second electrode bus 121 also includes one or more second connection tab 128 extending from the second body portion 126 towards the first electrode 110. Second connection tab(s) 128 are positioned for making electrical contact with the third connection tab 218 located vertically below. The third connection tab 218 extends from the third electrode bus 211, which is located on the opposite side of the medial plane 15.

In some embodiments, the capacitor structure 10 includes one or more additional metallization layers. For example, a third metallization layer 300 incudes a third electrode pair 302 with a fifth electrode 310 and a sixth electrode 320. In another embodiment, the capacitor structure 10 has the third metallization layer 300 and also has a fourth metallization layer 400, each including an electrode pair.

Figure 7A:
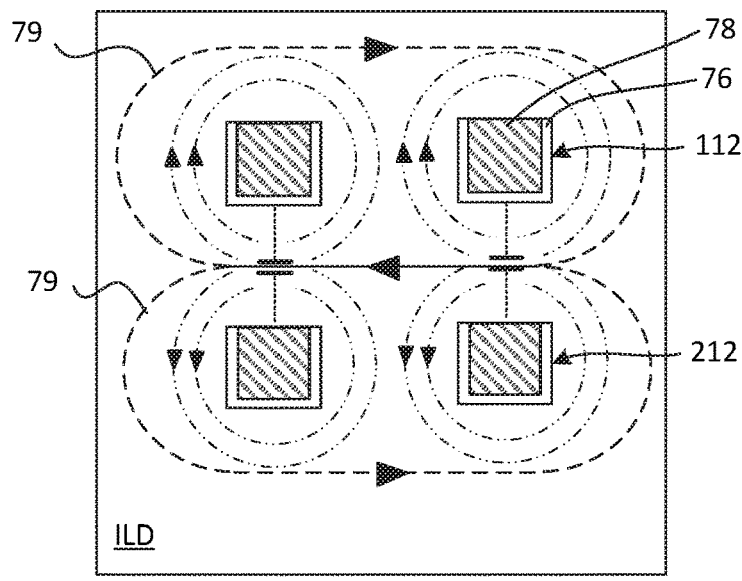
FIG. 7A is a cross-sectional view showing an example structure of electrode fingers in different metallization layers, the vertical capacitance between vertically aligned electrode fingers, and the induced magnetic fields in each of the electrode fingers, in accordance with an embodiment of the present disclosure.

Referring now to FIG. 7A, a cross-sectional view illustrates an example structure with two adjacent first electrode fingers 112 and two adjacent second electrode fingers 212, where each first electrode finger 112 is aligned vertically above one of the second electrode fingers 212. In some embodiments, an electrode is formed using a damascene process or variant thereof, where a liner material 76 is deposited along the bottom and sidewalls of a trench formed in an ILD layer. Copper or other suitable metal interconnect 78 material is then deposited in the lined trench and the structure is planarized. The resulting structure includes electrode fingers 112, 212 separated vertically by ILD material where the liner material 76 is not present along the top surface of the metal interconnect 78 as illustrated, for example, in FIG. 7. In some embodiments, the ILD material has a dielectric constant greater than 2, greater than 3, greater than 4, or greater than 5. In a vertical direction, adjacent electrodes exhibit negative mutual inductance. In a horizontal direction, adjacent electrodes exhibit a positive mutual inductance. Loops 79 represent the magnetic lines or a magnetic envelope resulting from the combined magnetic fields of horizontally adjacent electrodes.

Figure 7B:
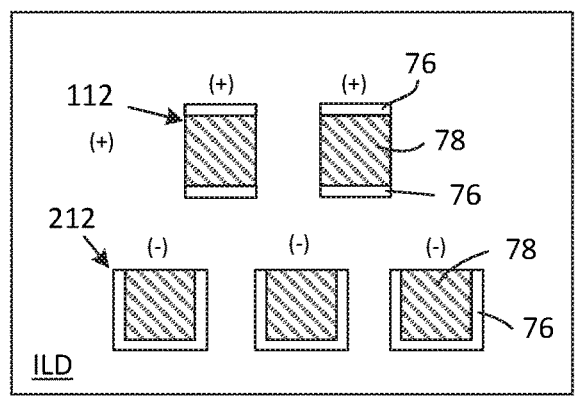
FIG. 7B illustrates a cross-sectional view showing another arrangement of electrodes in two different metallization layers, in accordance with an embodiment of the present disclosure.
Figure 7C:
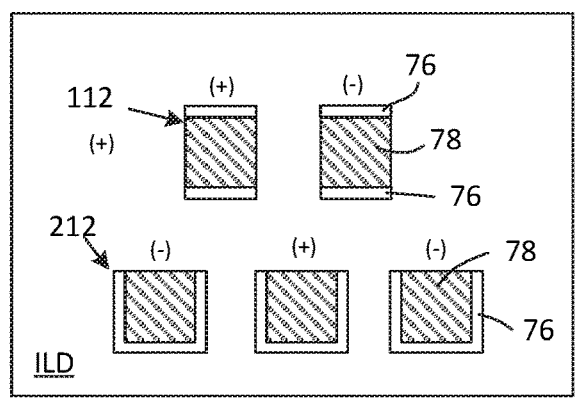
FIG. 7C illustrates a cross-sectional view showing another arrangement of electrodes in two different metallization layers, in accordance with an embodiment of the present disclosure.

FIG. 7B is another cross-section showing another arrangement of electrodes 112, 212 in two different metallization layers. The lower metal layer has the liner 76 on the side and bottom surfaces, similar to as shown in FIG. 7A. Electrodes 112 have a first potential (e.g., +) and are vertically aligned above spaces between electrodes 212, which have a second potential (e.g., −). Laterally adjacent electrodes 112 or 212 exhibit enhanced mutual inductance since current flows in the same direction. Electrodes 112, 212 exhibit decreased mutual inductance in a vertical direction since current flows in opposite directions. The upper metal layer has a liner 76 on the bottom and top surface, but not on the sidewall surfaces. Optimum quality factor of the capacitor can be achieved by maximizing the capacitance between electrode finger surfaces that contain no liner and/or minimizing the capacitance contribution from electrode finger surfaces which contain a liner. The quality factor can also be optimized if the number of liner layers is limited between two electrode surfaces having different potential. For example, combining a surface without a liner and a surface with a liner will lead to a higher quality factor compared to combining surfaces that both have a liner as shown, for example, in FIG. 7A for vertically spaced fingers above each other. FIG. 7C shows the metallization of FIG. 7B, but with another example arrangement of potential distribution between the electrode fingers 112, 212. Electrodes 112 have alternating potentials (e.g., +, −) and are vertically aligned above spaces between electrodes 212, which also have alternating potentials (e.g., −, +). Laterally adjacent electrodes 112 or 212 exhibit reduced mutual inductance since current flows in opposite directions. Electrodes 112, 212 exhibit a combination of enhanced mutual inductance (i.e. positive mutual inductance) with electrodes of the same charge (e.g., electrode 112 (+) and electrode 212 (+)) and decreased mutual inductance (i.e. negative mutual inductance) with electrodes of an opposite charge (e.g., electrode 112 (+) and electrode 212 (−)). In general, the capacitors mentioned in this application refer to capacitors comprising metals in the fingers of both electrodes 112, 212. The metals can be copper, copper alloys, aluminum, aluminum alloys, gold, gold alloys or other suitable conductive metal. The liner 76 material can be titanium nitride, tantalum nitride, tungsten or any other suitable conductive material. The liner 76 can cover the full surface of the metal 78 or only part of it as shown in FIGS. 7A, 7B, and 7C. The liner 76 material forms with the core or center metal 78 a metal stack through which the capacitive current flows. In some embodiments, more than one metal liner 76 material could be used. The liner 76 material could be replaced also by an effectively non-conductive dielectric material.

Vertical capacitance can occur when the first electrode fingers 112 and the second electrode fingers 212 have different electrical potentials, as will be appreciated. In this example, a metal-dielectric-metal capacitor is defined vertically between each first electrode finger 112 and the second electrode finger 212 below it. The capacitance goes through one layer of liner material 76 located along the bottom of the interconnect 78 of the first electrode fingers 112. In contrast, some capacitor designs utilizing horizontal capacitance between adjacent electrode fingers in the same plane may involve two layers of liner material 76 since the sidewalls of each trench are lined with liner material 76. The liner material 76 can negatively impact the Q-factor of the capacitor. Thus, an advantage of capacitance structures 10 of the present disclosure is favorable performance due to the use of vertical capacitance that avoids one or more layer of liner material 76.

FIG. 7 also shows magnetic field lines for magnetic fields induced by current in the respective electrode fingers 112, 212. Since the first electrode fingers 112 have an opposite electrical potential compared to second electrode fingers 212, the current flow is also in opposite directions and therefore the induced magnetic field lines are in opposite directions. For this reason, vertically aligned electrode fingers 112, 212 of different electrical potentials exhibit vertical inductance cancellation, but horizontally adjacent first electrode fingers 112 and second electrode fingers 212 do not since their magnetic fields are aligned in the same direction, which may actually lead to an inductance enhancement due to a positive mutual inductance. In order to minimize the lateral mutual inductance, the horizontal spacing between fingers can be increased, but this leads to decreased cap density. For an optimum inductance reduction, for example, the vertical spacing is small and the lateral spacing between fingers in the same metallization level is greater than the vertical spacing.

Figure 8:
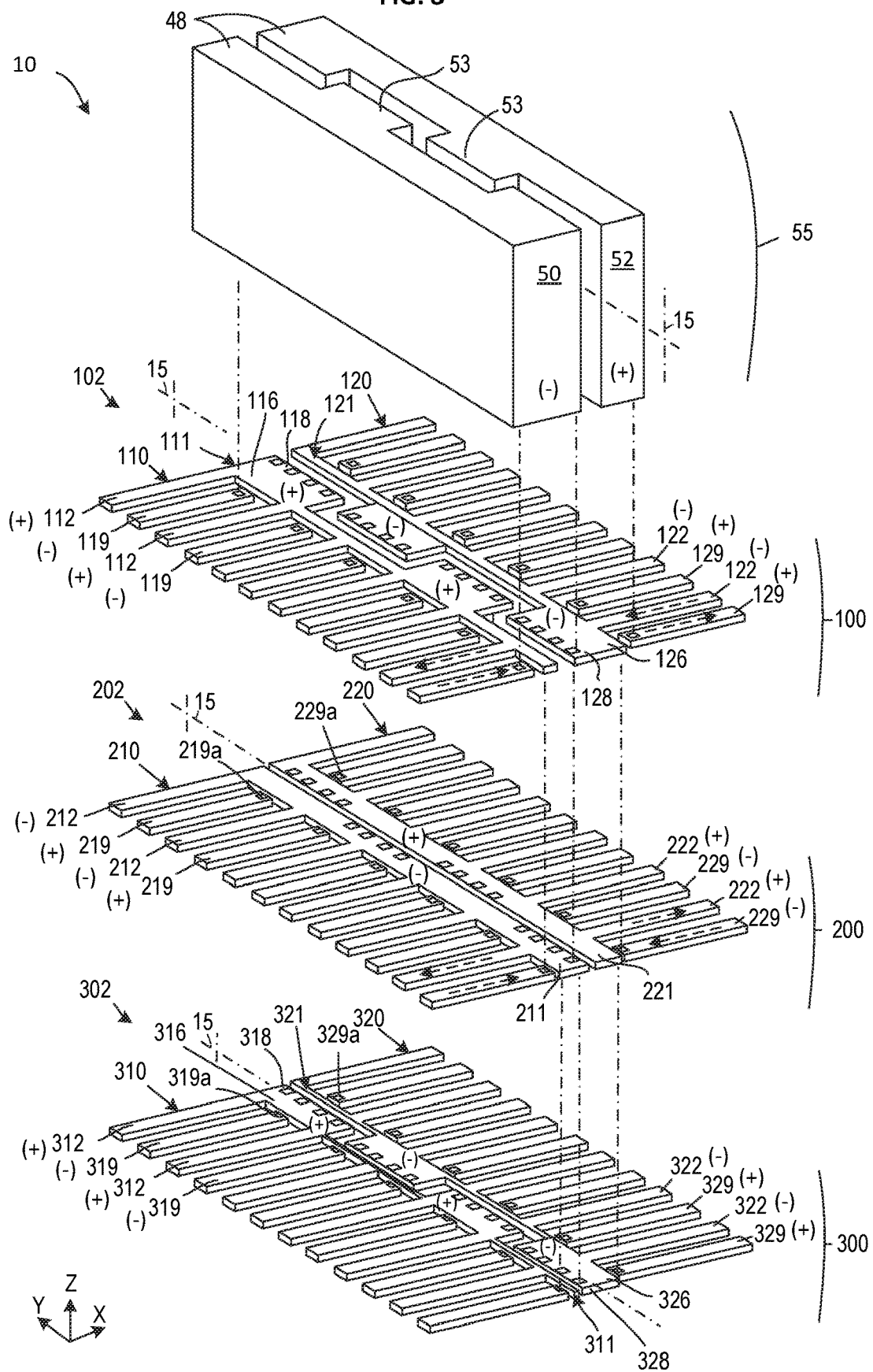
FIG. 8 is an exploded, perspective view showing a coupled line and the comb-like electrodes in first, second, and third metallization layers of an integrated circuit, where each electrode has isolated electrode fingers interleaved with electrode fingers attached to the electrode bus, in accordance with an embodiment of the present disclosure.
Figure 9:
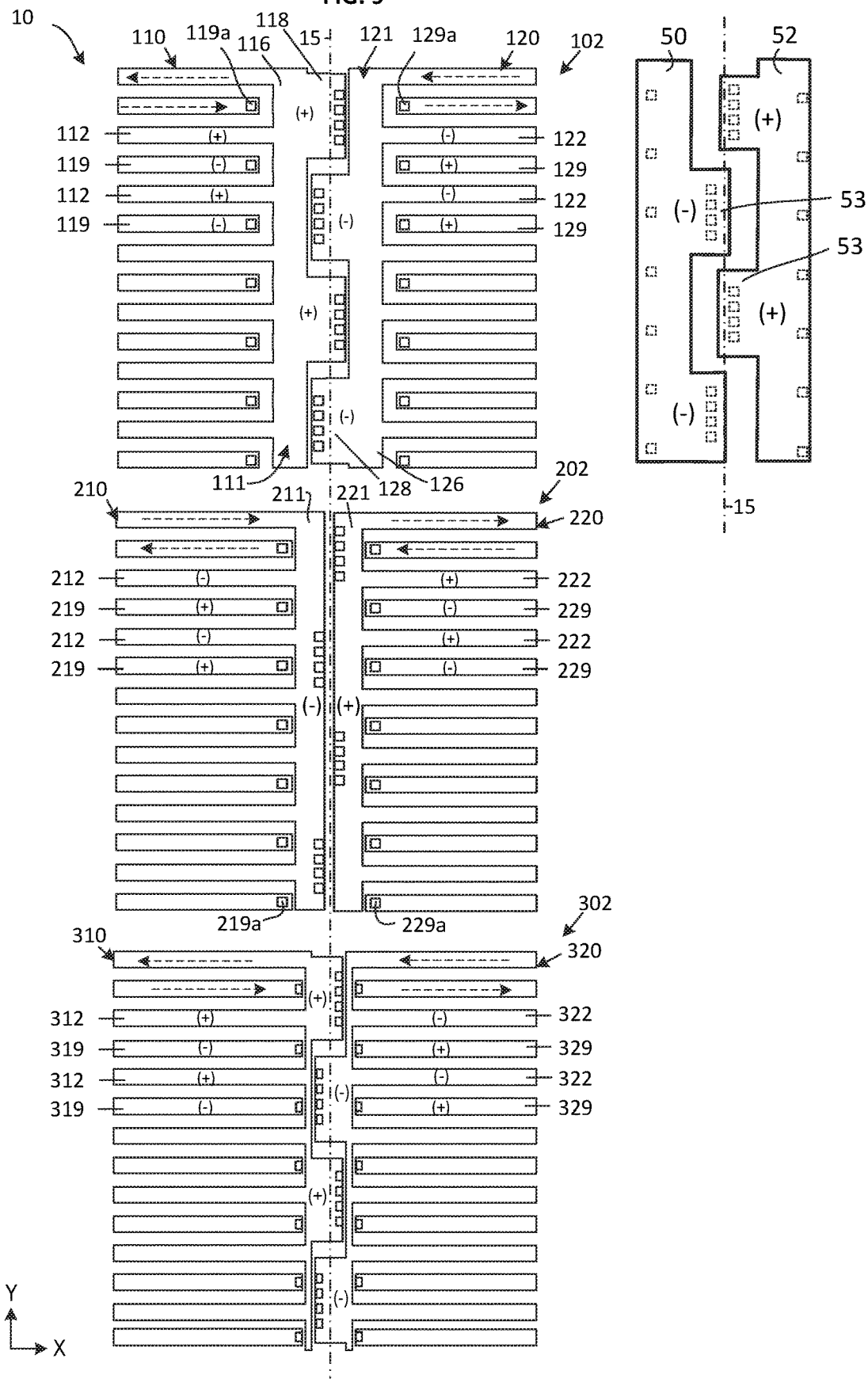
FIG. 9 is a plan view separately showing electrode pairs of the first, second, and third metallization layers of the capacitor structure of FIG. 8, in accordance with an embodiment of the present disclosure.

Referring now to FIGS. 8 and 9, capacitor structure 10 is illustrated in accordance with another embodiment of the present disclosure. FIG. 8 illustrates a perspective, exploded view of the capacitor structure 10 with first and second lines 50, 52 of a coupled line 48 and electrode pairs 102, 202, 302 in first, second, and third metallization layers 100, 200, 300, respectively. FIG. 9 illustrates separate plan views of each metallization layer 55, 100, 200, 300. The example capacitor structure 10 of FIGS. 8-9 is configured to utilize vertical and horizontal capacitance as well as vertical and horizontal inductance cancellation. The capacitor structure 10 is consistent with a finger capacitor with electrodes in parallel, horizontal planes. Compared to embodiments discussed above with reference to FIGS. 5-6, the capacitor structure 10 of FIGS. 8-9 has electrodes that include unattached or isolated fingers interleaved with the electrode fingers attached to the electrode bus. Advantages of some such embodiments include, for example, a higher Q-factor and very high resonant frequency due to enhanced inductance cancellation.

The first electrode pair 102 includes a first electrode 110 and a second electrode 120. The first electrode 110 has a first electrode bus 111 with first electrode fingers 112 connected to and extending in a first direction away from the first electrode bus 111 in a parallel, spaced-apart relationship. The gap between adjacent first electrode fingers 112 is sufficient to accommodate an unattached or isolated first electrode finger 119 in the gap. In some embodiments, isolated first electrode fingers 119 are interleaved with the first electrode fingers 112 attached to the first electrode bus 111, where each first electrode finger 112 has an adjacent isolated first electrode finger 119. In such a 1:1 ratio, the inductance of each first electrode finger 112 is at least partially cancelled by the inductance of a horizontally adjacent one of the isolated first electrode fingers 119.

Similarly, the second electrode 120 has a second electrode bus 121 with second electrode fingers 122 connected to and extending in a second direction away from the second electrode bus 121 in a parallel, spaced-apart relationship. Isolated second electrode fingers 129 are interleaved with the second electrode fingers 122 attached to the second electrode bus 121. The second electrode bus 121 extends parallel to and is spaced from the first electrode bus 111. For example, the first electrode bus 111 is on one side of the medial plane 15 and the second electrode bus 121 is on the opposite side of the medial plane 15.

The second metallization layer 200 is positioned vertically below the first metallization layer 100 and spaced therefrom by an interlayer dielectric (not shown), as will be appreciated. The second metallization layer 200 includes a second electrode pair 202 that includes a third electrode 210 positioned vertically below the first electrode 110 and a fourth electrode 220 positioned vertically below the second electrode 120. The third electrode 210 has a third electrode bus 211 with third electrode fingers 212 connected thereto and extending in the first direction away from the third electrode bus 211 in a parallel, spaced-apart relationship. Isolated third electrode fingers 219 are interleaved with the third electrode fingers 212 attached to the third electrode bus 211. In some embodiments, each of the third electrode fingers 212 is aligned below and corresponds to one of the first electrode fingers 112 and each of the isolated third electrode fingers 219 is aligned below and corresponds to one of the isolated first electrode fingers 119, or vice versa.

The fourth electrode 220 has a fourth electrode bus 221 with fourth electrode fingers 222 connected thereto and extending in the second direction away from the fourth electrode bus 221 in a parallel, spaced-apart relationship. Isolated fourth electrode fingers 229 are interleaved with the fourth electrode fingers 222 attached to the fourth electrode bus 221. The fourth electrode bus 221 extends along the medial plane 15 and is spaced from the third electrode bus 211. The fourth electrode bus 221 is aligned below the second electrode bus 121. In some embodiments, each of the fourth electrode fingers 222 is aligned below and corresponds to one of the second electrode fingers 122 and each isolated fourth electrode finger 229 is aligned below and corresponds to one of the isolated second electrode fingers 129, or vice versa.

As with some embodiments discussed above, connection tabs 118, 128 on the first and second electrodes buses 111, 121, respectively, are configured to couple the first electrode 110 to second line 52 and couple the second electrode 120 to first line 50. In one embodiment, for example, the first electrode bus 111 is coupled to second line 52 (e.g., (+)) and the second electrode bus 121 is coupled to first line 50 (e.g., (−)). Accordingly, the first electrode fingers 112 (attached) are coupled to the positive charge of second line 52 and the second electrode fingers 122 (attached) are coupled to the negative charge of first line 50. In some embodiments, the connection tabs 118, 128 extend across the medial plane 15 so that part of the connection tab is vertically below the line that is generally positioned on the opposite side of the medial plane 15. In some embodiments, the first and second lines 50, 52 may be shaped to facilitate connection to the connection tabs 118, 128 of the electrode on the opposite side of the median axis 15. For example, one or both of the first and second lines 50, 52 feature a protrusion or contact tab 53 configured to align with the connection tab of the electrode on the opposite side of the medial plane 15.

The isolated first electrode fingers 119 are electrically connected to first line 50 vertically above them (i.e., to the other line compared to that of the attached first electrode fingers 112). For example, metal interconnect makes contact with each isolated first electrode finger 119 on an end portion 119a adjacent the first electrode bus 111 and extends vertically to first line 50. Squares on the isolated first electrode fingers 119 represent example locations for via plugs that extend upward to connect to first line 50. Similarly, the isolated second electrode fingers 129 are electrically connected by via plugs to second line 52 (i.e., the other line of the coupled line 48 compared to the attached second electrode fingers 122). For example, a via plug makes contact with each isolated second electrode finger 129 on an end portion 129a adjacent the second electrode bus 121, and extends to second line 52.

When the first and second lines 50, 52 have different electrical potentials (e.g., negative, positive), for example, the first electrode fingers 112 and isolated first electrode fingers 119 are coupled to these different electrical potentials so that these fingers alternate between positive and negative potential. Similarly, the second electrode fingers 122 (attached) and the isolated second electrode fingers 129 are coupled to different potentials and therefore alternate between negative and positive, for example. Accordingly, adjacent electrode fingers of each electrode (i.e., one attached, one isolated) have different electrical potentials that result in horizontal capacitance between the adjacent electrode fingers. The different electrical potential also provides opposite current flow in adjacent electrode fingers, therefore providing horizontal inductance cancellation between adjacent electrode fingers.

The third electrode bus 211 is aligned below portions of the second connection tabs 128. As such, the third electrode fingers 212 (attached to bus 211) are coupled to the second electrode bus 121 and to the potential of first line 50 (e.g., (−)). In contrast, end portions 219a of the isolated third electrode fingers 219 are coupled to the first electrode bus 111, and therefore to second line 52 (+). Accordingly, the third electrode fingers 212 and isolated third electrode fingers 219 have different (e.g., opposite) electrical potentials and opposite current directions. Therefore, the third electrode 210 exhibits horizontal capacitance between adjacent fingers and horizontal inductance cancellation between adjacent fingers. Each third electrode finger 212 also has a different (opposite) charge compared to the first electrode finger 112 vertically above it and compared to the fifth electrode finger 312 vertically below it. Each isolated third electrode finger 219 has a different (opposite) charge compared to the isolated first electrode finger 119 vertically above it and compared to the isolated fifth electrode finger 319 vertically below it. Therefore, fingers of the third electrode 210 and the first electrode 110 exhibit vertical capacitance and vertical inductance cancellation. When capacitor structure 10 includes third electrode pair 302, fingers of the third electrode 210 additionally exhibit vertical capacitance and vertical inductance cancellation with the fifth electrode 310.

The fourth electrode bus 221 is aligned below portions of the first connection tabs 118. As such, the fourth electrode fingers 222 (attached to bus 221) are coupled to first electrode bus 111 and to the potential of second line 52 (e.g., (+)). In contrast, end portions 229a of the isolated fourth electrode fingers 229 are coupled to the second electrode bus 121, and therefore to first line 50 (−). Accordingly, the fourth electrode fingers 222 and isolated fourth electrode fingers 229 have different (e.g., opposite) electrical potentials and opposite current directions. Therefore, the fourth electrode 220 exhibits horizontal capacitance between adjacent fingers and horizontal inductance cancellation between adjacent fingers. Each fourth electrode finger 222 also has a different (opposite) charge to the second electrode finger 122 vertically above it and each isolated fourth electrode finger 229 has a different (opposite) charge to the isolated second electrode finger 129 vertically above it. Therefore, fingers of the fourth electrode 220 and the second electrode 120 exhibit vertical capacitance and vertical inductance cancellation. Similar to the third electrode 210, the fourth electrode 220 exhibits vertical capacitance and vertical inductance cancellation with the sixth electrode 320 (when present).

Arrows in FIGS. 8 and 9 illustrate the opposite directions of current flow along the first electrode fingers 112 and the isolated first electrode fingers 119. The same applies to the second electrode 120, third electrode 210, and fourth electrode 220 (and fifth electrode and sixth electrode, when present). As discussed above, opposite current flows in adjacent electrode fingers, whether vertically aligned or horizontally aligned, can result in induced magnetic fields of opposite directions, and therefore inductance cancellation between the adjacent electrode fingers. As applied to the capacitor structure 10 of FIGS. 8-9, the capacitor structure 10 exhibits both horizontal capacitance and horizontal inductance cancellation within each electrode, as well as vertical capacitance and vertical inductance cancellation between electrode fingers on vertically adjacent metallization layers.

In some embodiments, the capacitor structure 10 includes one or more additional metallization layers. In another embodiment, the capacitor structure 10 includes a third metallization layer 300. In one embodiment, third metallization layer 300 incudes a third electrode pair 302 with a fifth electrode 310 and a sixth electrode 320. In yet another embodiment, the capacitor structure 10 includes the third metallization layer 300 and fourth metallization layer 400, each including an electrode pair.

In one example, third electrode pair 302 and fourth electrode pair 402 have a similar structure to the first electrode pair 102 and second electrode pair 202, respectively, as discussed above with reference to FIGS. 8-9. Such electrode pairs 302, 402 may utilize horizontal and vertical capacitance as well as horizontal and vertical inductance cancellation.

For example, the fifth electrode 310 includes a fifth electrode bus 311 with fifth electrode fingers 312 extending from the fifth electrode bus 311 in a parallel, spaced-apart relationship. Isolated fifth electrode fingers 319 are interleaved with the fifth electrode fingers 312. Fifth connection tabs 318 extend from the fifth electrode bus across the medial plane 15 for electrical coupling to the fourth electrode bus 221. The sixth electrode 320 includes a sixth electrode bus 321 with sixth electrode fingers 322 extending from the sixth electrode bus 321 in a parallel, spaced-apart relationship. Isolated sixth electrode fingers 329 are interleaved with the sixth electrode fingers 322 attached to the sixth electrode bus 321. Sixth connection tabs 328 extend from the sixth electrode bus 321 across the medial plane 15 for electrical coupling to the third electrode bus 211. An end portion 319a of each isolated fifth electrode finger 319 can be coupled to the third electrode bus 211 and an end portion 329a of each isolated sixth electrode finger 329 can be coupled to the fourth electrode bus 221. As such the third electrode pair can exhibit horizontal capacitance and horizontal inductance cancellation between adjacent electrode fingers, in accordance with an embodiment of the present disclosure. In another embodiment, isolated fifth electrode fingers 319 can be electrically connected to the isolated third electrode fingers 219 and the isolated sixth electrode fingers 329 can be electrically connected to the isolated fourth electrode fingers 329, as will be appreciated.

In another example, the third electrode pair 302 and fourth electrode pair 402 can be comb capacitors with interdigitated electrode fingers. For example, the third and/or fourth electrode pair 302, 402 can have the structure of the first electrode pair 102 or second electrode pair 202 discussed above and illustrated in FIG. 1. In yet another example, the third electrode pair 302 and/or fourth electrode pair 402 can be comb capacitors with electrode fingers extending in opposite directions, such as first electrode pair 102 and second electrode pair 202 discussed above and illustrated in FIG. 5. Numerous configurations and variations will be apparent in light of this disclosure.

Example Circuits and Circuit Models

The capacitor structure 10 in accordance with embodiments of the present disclosure can be implemented in a variety of circuits. In some embodiments, the circuit utilizes the four-terminal geometry of the capacitor circuit 10 for connectivity not achieved with other capacitors having only two terminals. Unlike other capacitor architectures, the four-terminal configuration of the capacitor structure 10 enables direct connection to a transformer and other device components.

Figure 10:
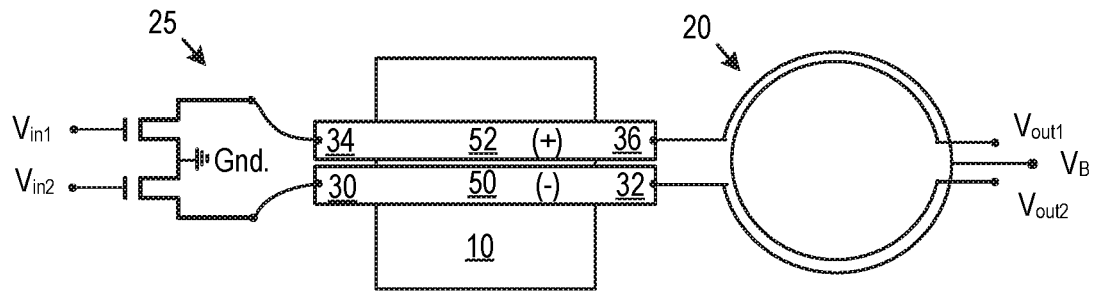
FIGS. 10 and 11 illustrate a diagram of a circuit that includes a capacitor structure coupled between a transformer and a differential FET amplifier, in accordance with some embodiments of the present disclosure.
Figure 11:
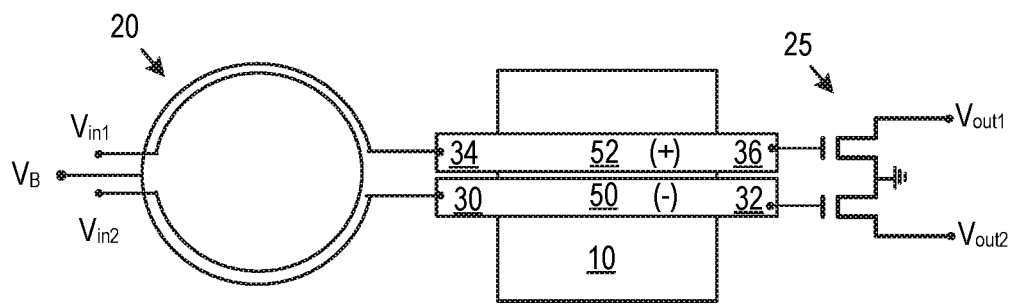

FIG. 10 illustrates an example circuit where the capacitor structure 10 is electrically connected between a transformer 20 and a differential FET amplifier 25. The supply voltage VB of the differential MOSFET pair 25 is connected to the supply voltage $V_{dd}$ of the circuit. Each voltage output $V_{out1}$ and $V_{out2}$ of the differential FET amplifier 25 is connected to the differential inputs (terminals 30, 34) of the capacitor structure 10. For example, the capacitor structure 10 has differential inputs at the first terminal 30 (e.g., negative) and third terminal 34 (e.g., positive) and differential outputs at the second terminal 32 (e.g., negative) and fourth terminal 36 (e.g., positive). The first terminal 30 and third terminal 34 are configured as differential inputs to the capacitor structure 10, and the second terminal 32 and the fourth terminal 36 are configured as differential outputs. The output voltages $V_{out1}$ and $V_{out2}$ of the differential FET amplifier 25 are connected to the differential inputs (first terminal 30 and third terminal 34) of the capacitor structure 10. The transformer 20 is connected to the outputs (second terminal 32 and fourth terminal 36) of the capacitor structure 10. The transformer 20 may be either a high-k transformer or a low-k coupling-type transformer. Including the capacitor structure 10 in this circuit improves the gain and DC power consumption of the circuit. In another example illustrated in FIG. 11, the direction is reversed, where the transformer is connected to the differential inputs at first terminal 30 and third terminal 34 and the outputs from the capacitor structure 10 (second terminal 32 and fourth terminal 36) are connected to the gate inputs of the differential FET amplifier 25. A bias voltage VB is provided to the transformer 20.

Figure 12A:
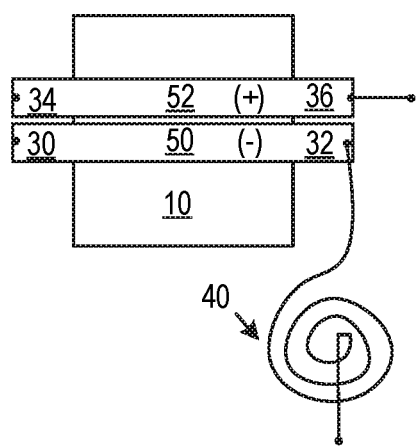
FIGS. 12A and 12B illustrate a diagram of a capacitor structure connected in a series LC matching circuit, in accordance with some embodiments of the present disclosure.
Figure 12B:
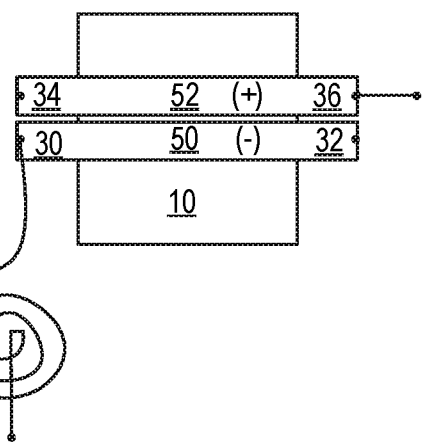

In another embodiment illustrated in the diagrams of FIGS. 12A and 12B, various embodiments of the capacitor structure 10 can be connected to a coil 40 in a single-end LC series matching circuit. In one example shown in FIG. 12A, the coil 40 is connected to the second terminal 32 of the first line 50 (e.g., negative output) and another connection is made to the fourth terminal 36 on the second line 52 (e.g., positive output). In another example shown in FIG. 12B, the coil 40 is connected to the first terminal 30 of the first line 50 (e.g., negative input) and another connection is made to the fourth terminal 36 on the second line 52 (e.g., positive output).

Figure 13:
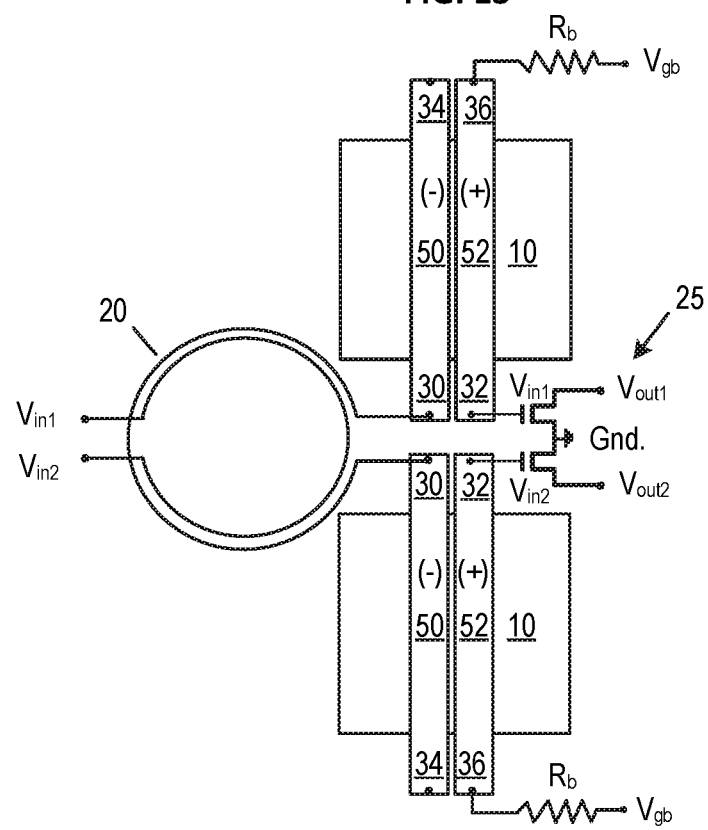
FIG. 13 illustrates a circuit diagram that includes two capacitor structures coupled to a transformer and a differential FET amplifier, in accordance with an embodiment of the present disclosure.

FIG. 13 illustrates a diagram for a series LC-matching differential circuit that includes two capacitor structures 10, a transformer 20, and a differential FET amplifier 25. A transformer 20 is connected to the negative input (first pin 30) of each capacitor structure 10. A gate bias voltage $V_{gb}$ is supplied through a bias resistor $R_b$ to the fourth pin 36 of each capacitor structure 10. The voltage inputs $V_{in1}$ and $V_{in2}$ of the differential FET amplifier 25 are connected to the positive input terminal (second pin 32) of each capacitor structure 10.

Embodiments of the capacitor structure 10 in accordance with the present disclosure can be integrated into various semiconductor technologies, including planar bulk complimentary MOSFET devices (CMOS), FinFET CMOS, semiconductor on insulator (SOI) devices, and devices made with indium phosphide (InP), gallium arsenide (GaAs), gallium nitride (GaN), and silicon carbide (SiC). Additionally, the capacitor structures 10 of the present disclosure can be utilized in packaging technologies, such as embedded wafer level ball grid array (e-WLB). Numerous configurations and variations will be apparent in light of this disclosure.

Figure 14A:
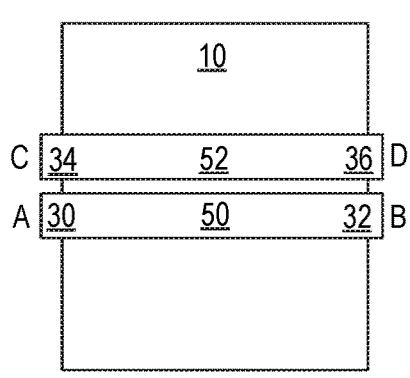
FIG. 14A illustrates a representation of a capacitor structure and a circuit diagram useful to model the capacitor structure, in accordance with an embodiment of the present disclosure.
Figure 14A:
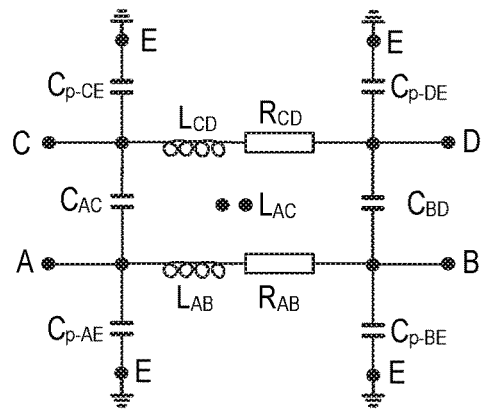

FIG. 14A illustrates a circuit model of a capacitor structure 10 having first and second lines 50, 52 and four terminals 30, 32, 34, 36, in accordance with some embodiments of the present disclosure. The capacitor structure 10 is shown next to a model of the capacitor structure 10 with inductors L, resistors R, and capacitors C. For convenience of nomenclature, the terminals 30, 32, 34, 36 of the capacitor structure are labeled A, B, C, and D, respectively, when referring to a model of the capacitor structure 10. In some embodiments, for example, the capacitor structure 10 includes a fifth terminal E, which may be connected to ground (as shown in FIG. 14A) or to another potential in the circuit. For example, in a circuit with multiple ground terminals, the fifth terminal E is connected to one of the ground terminals of the circuit. In another embodiment, the fifth terminal E is connected to a N-type well junction in a p-type semiconductor substrate, where the N-type well resides below the metal layers of the capacitor structure. For resistors $R_{AB}$ and $R_{CD}$, the skin effect can be modeled as having resistance that increases with frequency and depends on the cross-sectional dimensions of the first and second lines 50, 52 of the coupled line 48. For inductors $L_{AB}$ and $L_{CD}$, the skin effect can be modeled as having decreasing inductance with increasing frequency, and depending on the frequency range and cross-sectional dimension of each of the first and second lines 50, 52 of the coupled line 48. A mutual inductance $L_{AC}$ between inductors $L_{CD}$ and $L_{AB}$ models the inductive behavior between the four terminals A, B, C, D when these terminals are connected to arbitrary impedances, including zero (e.g., a short to ground) or infinite (e.g., open circuit).

Figure 14B:
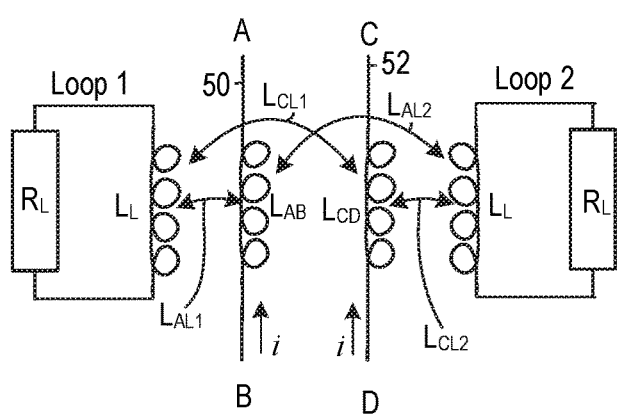
FIG. 14B illustrates the coupling of the coupled lines of a capacitor structure to conductor loops inside the capacitor structure modeled with a resistive element and an inductive element, in accordance with an embodiment of the present disclosure.
Figure 14C:
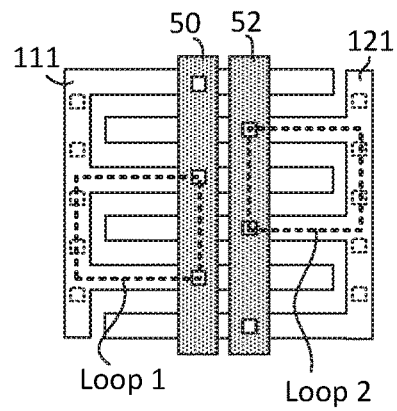
FIG. 14C illustrates a representation of loops of FIG. 14B, where each loop is formed with a line of a coupled line structure containing at least two lines driven by a differential mode excitation, and an electrode of the capacitor structure of FIG. 2, in accordance with an embodiment of the present disclosure.

Referring to FIG. 14B, the magnetic coupling of inductors $L_{CD}$ and $L_{AB}$ to closed loops inside the capacitor structure (denoted in FIG. 14C) can be modeled by mutual inductances $L_{AL1}$, $L_{AL2}$, $L_{CL1}$ and $L_{CL1}$, where each closed loop is modeled having a resistive element with loop resistance $R_L$ and an inductive element with loop inductance $L_L$ as shown, for example, in FIG. 14B. FIG. 14C illustrates an example of Loop 1 formed with the first line 50 and first electrode 111 of the capacitor structure 10 of FIG. 2. Loop 2 is formed with the second line 52 and second electrode 121 of the capacitor structure 10 of FIG. 2. When the current flow through inductors $L_{CD}$ and $L_{AB}$ is in the same direction as, for example under common mode excitation of the coupled line, magnetic fields of the first line 50 and second line 52 add together and induce currents in the closed loops. The induced currents in the loops generate magnetic fields which cancel at least in part the magnetic field of the first and second line of the coupled line, i.e. the induced loop currents reduce the inductance of the first and second line of the coupled line and lead to inductance cancelation. However, under differential mode excitation of the coupled line, inductance of the first line 50 and second line 52 is reduced due to negative mutual inductance which leads to inductance cancellation between the first line 50 and the second line 52. Specifically, inductor $L_{CD}$ exhibits mutual inductance with inductor $L_{AB}$ and with loop 2, and inductor $L_{AC}$ exhibits mutual inductance with inductor $L_{CD}$ and with loop 1. Under differential mode excitation of the coupled line, the current flow through inductors $L_{CD}$ and $L_{AB}$ instead is in the opposite direction, magnetic fields of the first line 50 and the second line 52 cancel at least partially, resulting in a reduced magnetic field. In such a situation, the effect of magnetic coupling induced currents in Loop 1 and Loop 2 is relatively very small or negligible, and the modeled circuit behaves as if Loop 1 and Loop 2 do not exist.

Figure 14D:
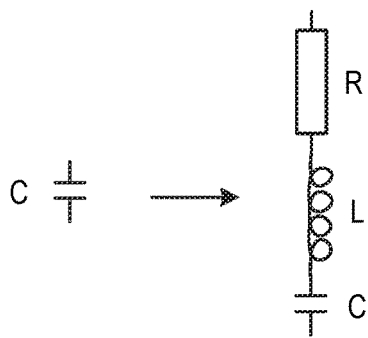
FIG. 14D illustrates a representation of a resistor-inductor-capacitor series circuit used to model a capacitor of the capacitor structure of FIG. 14A, in accordance with an embodiment of the present disclosure.

Referring now to FIG. 14D, the capacitive contribution of the finger capacitors $C_{AC}$ and/or $C_{BD}$ of FIG. 14A, connected in a distributed manner to the coupled line, can be modeled by a RLC series circuit, where the resistance R in the RLC series circuit can be modeled by a geometrical scaling equation, such as Equation 3, that depends on the finger length L and finger width W:

$$R=R_A(L/W)+R_B/(LW) \qquad \text{Equation 3}$$

where
R=resistance
$R_A$=resistance parameter along the finger length L
$R_B$=resistance parameter along the finger width W
L=finger length
W=finger width Values for the resistance parameters $R_A$ and $R_B$ can be calculated by measuring the value of resistance R with respect to finger length L of the capacitor structure 10, and using known values for L and W, as will be appreciated. In Equation 3, resistance R may be characterized as a dissipating resistance of an RC series circuit, as will be appreciated. In some embodiments, the resistance R may not follow exactly the dependence on finger length L given by Equation 3, but any equation or relationship is suitable to model the resistance R when the value of resistance R has a minimum value at a certain finger length $L_x$ greater than zero, and increases in value for shorter or longer finger lengths L. That is, for at least some values of finger length L, resistance R increases with decreasing finger length L. The resistive contribution of $R_B/L$ in the model equation, which leads to a minimum for the resistance R in Equation 3, can be determined by detecting a non-zero second order derivative $d^2R/dL^2$. The resistance R may be frequency dependent due to a frequency dependence in $R_B$, and may be frequency dependent as the metal liner may not cover the complete surface as depicted in FIG. 7. Each surface part of the metal covered by a conductive metal liner material or an effectively non-conductive non-metal liner dielectric material contributes to the total resistance R of the capacitor, i.e. $R_B$ is an effective resistance due to a parallel connection of resistances going through different surfaces covered by a liner or not covered by a liner. This contribution of parallel connected capacitors, which contain different resistances, may lead to a decrease of the resistance parameter $R_B$ and of the total resistance R with increasing frequency in Equation 3. Parasitic capacitance may exist between the fifth terminal E (connected to ground in FIG. 14A) and one or more of terminals 30, 32, 34, 36 of the first and second lines 50, 52. In some embodiments, for example, the fifth terminal E is a reference potential corresponding to a semiconductor material layer (e.g., a silicon base), a metal layer, or other integrated circuit structure below and/or above the capacitor structure 10.

Figure 14E:
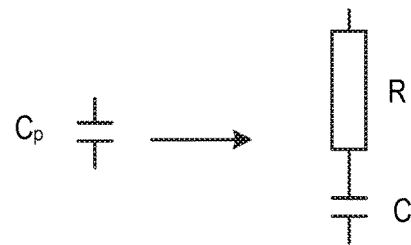
FIG. 14E illustrates a representation of a resistor-capacitor series circuit used to model parasitic capacitance in the capacitor structure of FIG. 14A, in accordance with an embodiment of the present disclosure.

Referring to FIG. 14E, parasitic capacitance $C_{p-AE}$, $C_{p-BE}$, $C_{p-CE}$, $C_{p-DE}$ between the fifth terminal E (e.g., ground) and each of terminals 30, 32, 34, 36, respectively, can be modeled by a series RC circuit, as will be appreciated.

The model presented in FIG. 14A-14E can be cascaded/chained to model a cascaded/chained connection of individual capacitive loaded coupled line structures as described in FIGS. 1-9, or can be used to model sub-sections of a single individual capacitive loaded coupled line structure. Such sub-sectioning may allow a more accurate simulation by modeling the distributed nature of the capacitive loaded coupled line structure at the expense of more sub-circuit modeling nodes leading to longer simulation time. The sub-sectioning may offer the possibility to trade off simulation time with simulation accuracy and allow to adapt computing resources and simulation time to the required simulation accuracy, as will be appreciated.

Fabrication

In general, capacitor structures 10 according to the present disclosure can be fabricated using any suitable semiconductor fabrication techniques, including deposition, photolithography, wet or dry chemical etching processes, chemical mechanical polishing, deposition or epitaxial growth processes (e.g., CVD, PVD, ALD, VPE, MBE, LPE), melt regrowth, and/or any other suitable processing, as will be appreciated. The capacitor structure 10 can be part of a backend process, such as the back end of line (BEOL) process of a semiconductor integrated circuit. As such, the capacitor structure 10 can be fabricated as part of, or concurrently with, the metal interconnection layers of a semiconductor fabrication process. In example embodiments, electrode pairs of the capacitor structure 10 can be fabricated using a damascene or dual damascene process in the BEOL metallization processing of an integrated circuit, as will be appreciated. Additionally, the capacitor structures 10 of the present disclosure can be manufactured using manufacturing techniques of packaging technologies, such as used for embedded wafer level ball grid array (e-WLB).

Example System

Figure 15:
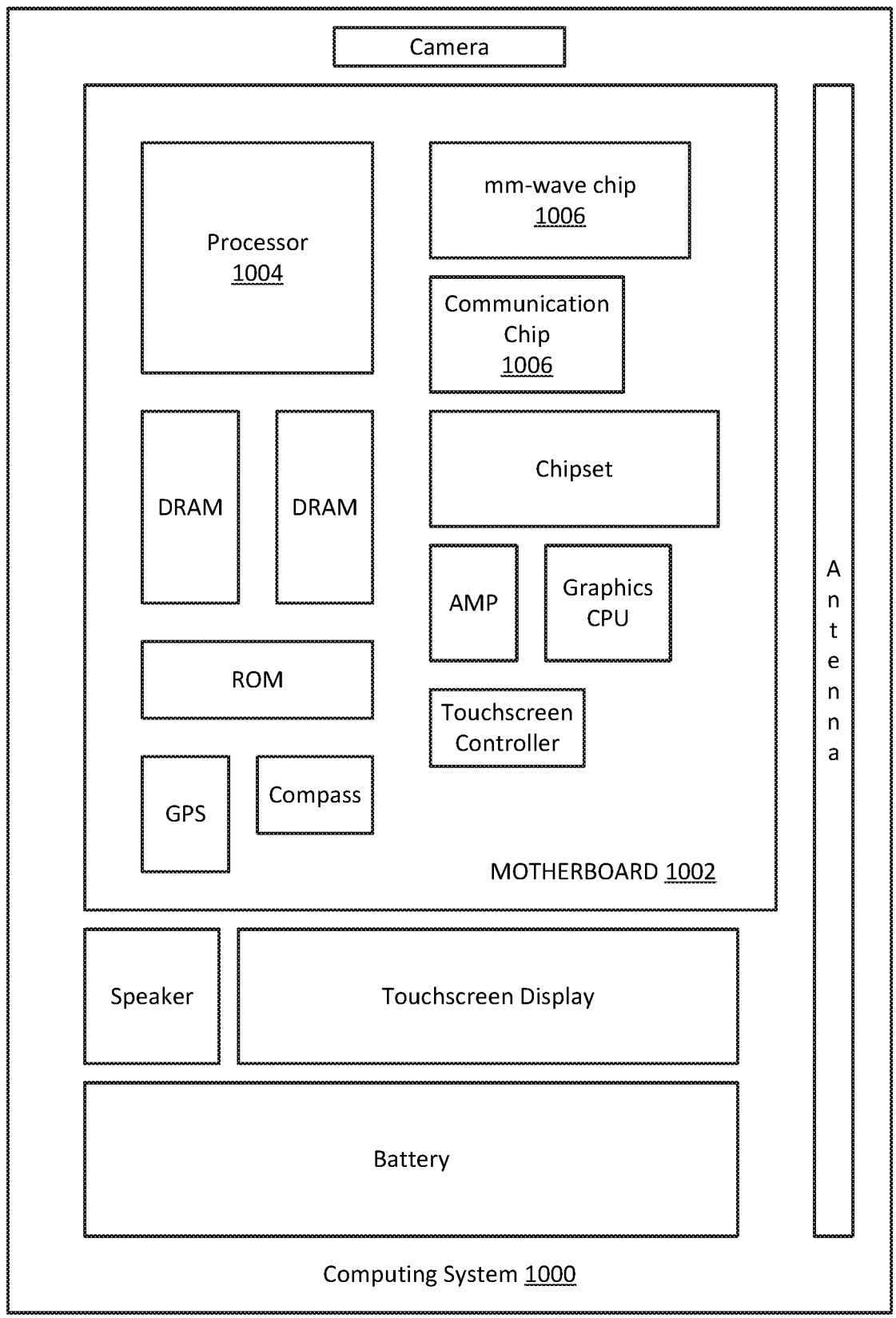
FIG. 15 illustrates a diagram of an example system utilizing an integrated circuit with one or more capacitor structure configured for at least partial vertical inductance cancellation, in accordance with an embodiment of the present disclosure.

FIG. 15 is an example computing system 1000 implemented with one or more of the integrated circuit structures that implement one or more capacitor structures 10 as disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006. Communication chip 1006 can be or have integrated a millimeter wave radar, a millimeter wave imaging, a millimeter wave sensing, a millimeter wave scanning chip or chip part. For example, millimeter wave frequencies may range from 24-300 GHz in system 1006. Each communication chip 1006 can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM, SRAM), non-volatile memory (e.g., ROM, Flash-Memory, OTP, EPROM), a graphics processor, a digital signal processor, a crypto processor, a chipset, an antenna, an antenna array for beamforming, multiple antennas or multiple antenna arrays for diversity and interference cancellation, antennas or antenna arrays with adjustable polarization, a display, a touchscreen display, a touchscreen controller, a battery, an audio codec, a video codec, a power amplifier, a low-noise amplifier (LNA), phase shifters for beamforming, bi-directional amplifiers, a global positioning system (GPS) device, a compass, an accelerometer, a gyroscope, a millimeter wave gesture sensor, a speaker, a camera, and a mass storage device (such as hard disk drive, compact disk (CD), digital versatile disk (DVD), and so forth). Any of the components included in computing system 1000 may include one or more integrated circuit structures or devices configured in accordance with an example embodiment (e.g., to include one or more HBTs fabricated using a combination of epitaxial growth and LEO, as variously provided herein). In some embodiments, multiple functions can be integrated into one or more chips (e.g., for instance, note that the communication chip 1002 can be part of or otherwise integrated into the processor 1004, or communication chip 1002 contains millimeter wave circuit parts and digital baseband processing (for 5G, millimeter wave radar applications or millimeter wave imaging), or combines sub 7 GHz chip parts with millimeter wave chip parts operating above 24 GHz, or combines chip parts for different millimeter wave frequencies around 28 GHz (i.e. 24-33 GHz), 39 GHz (i.e. 37.5-43.5 GHz), 60 GHz (i.e. 57-71 GHz), 70 GHz (i.e. 70-76 GHz), 80 GHz (i.e. 79-86 GHz)), or combines 5G sub 7 GHz communication chip part with chip part that allow offloading part of the data stream into unlicensed ISM spectrum at millimeter wave frequencies around 60 GHz (eLAA).

The communication chip 1006 enables wireless communications for the transfer of data and information to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including, but not limited to, Wi-Fi (IEEE 802.11 family), WiGig (IEEE 802.11ad), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 406 may be dedicated to shorter range wireless communications such as Wi-Fi, WiGig, and Bluetooth and a second communication chip 1006 may be dedicated to longer range wireless communications such as GPS, EDGE, GPRS, CDMA, WiMAX, LTE, Ev-DO, 5G sub 7 GHz, 5G millimeter wave and others. In some embodiments, communication chip 1006 may include one or more transistor structures having a gate stack an access region polarization layer as variously described herein.

The processor 1004 of the computing system 1000 includes an integrated circuit die packaged within the processor 1004. In some embodiments, the integrated circuit die of the processor includes onboard circuitry that is implemented with one or more integrated circuit structures or devices as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit comprising a first metallization layer comprising a first electrode with first electrode fingers extending in a first direction from a first bus, the first bus extending transversely to and connected to respective ends of the first electrode fingers; and a second electrode with second electrode fingers extending in a second direction opposite the first direction from a second bus, the second bus extending transversely to and connected to respective ends of the second electrode fingers, wherein the first electrode fingers are interdigitated with the second electrode fingers, and the first bus is spaced from the second bus with the first electrode fingers and the second electrode fingers extending therebetween; a second metallization layer below the first metallization layer and comprising a third electrode with third electrode fingers extending from a third bus in the first direction, the third bus extending transversely to and connected to respective ends of the third electrode fingers, wherein each of the third electrode fingers is positioned vertically below and corresponds to one of the second electrode fingers, and wherein the third bus is connected to the first bus; and a coupled line comprising a first line and a second line, wherein the first line is connected to the first electrode fingers between the first bus and the second bus, and the second line is connected to the second electrode fingers between the first bus and the second bus.

Example 2 includes the subject matter of Example 1 and further comprises a first set of one or more metal interconnects in contact with and extending vertically between the first electrode and the third electrode.

Example 3 includes the subject matter of Examples 1 or 2 and further comprises a fourth electrode with fourth electrode fingers extending from a fourth bus in the second direction, the fourth bus extending transversely to and connected to respective ends of the fourth electrode fingers, wherein each of the fourth electrode fingers is positioned vertically below and corresponds to one of the first electrode fingers, and wherein the fourth electrode fingers are interdigitated with the third electrode fingers, and the third bus is spaced from the fourth bus with the third electrode fingers and the fourth electrode fingers extending therebetween, and wherein the fourth bus is connected to the second bus.

Example 4 includes the subject matter of Example 3 and further comprises a first set of one or more metal interconnects in contact with and extending vertically between the first electrode and the third electrode, and a second set of one or more metal interconnects in contact with and extending between the second electrode and the fourth electrode.

Example 5 includes the subject matter of Examples 3 or 4 and further comprises an additional metallization layer below the second metallization layer, the additional metallization layer including a fifth electrode with fifth electrode fingers extending from a fifth bus in the first direction, the fifth bus extending transversely to and connected to respective ends of the fifth electrode fingers, wherein each of the fifth electrode fingers is positioned vertically below and corresponds to one of the fourth electrode fingers; and a sixth electrode with sixth electrode fingers extending from a sixth bus, the sixth bus extending transversely to and connected to respective ends of the sixth electrode fingers, wherein each of the plurality of sixth electrode fingers is positioned vertically below and corresponds to one of the third electrode fingers, and wherein the sixth electrode fingers are interdigitated with the fifth electrode fingers, and the sixth bus is spaced from the fifth bus with the fifth electrode fingers and the sixth electrode fingers extending therebetween; wherein the fifth bus is connected to the third bus and the sixth bus is connected to the fourth bus.

Example 6 includes the subject matter of any of Examples 1-5, wherein when the first line has a first electrical potential and the second line has a second electrical potential different from the first electrical potential, and inductance of the first electrode fingers at least partially cancels inductance of the second electrode fingers.

Example 7 includes the subject matter of any of Examples 3-5, wherein inductance of the fourth electrode at least partially cancels inductance of the first electrode, and inductance of the third electrode at least partially cancels inductance of the second electrode.

Example 8 includes the subject matter of any of Examples 1-7, wherein the first line has a first terminal and a second terminal and the second line has a third terminal and a fourth terminal, the integrated circuit further comprising a differential FET amplifier coupled to the second terminal and the fourth terminal; and a transformer coupled to the first terminal and the third terminal.

Example 9 includes the subject matter of any of Examples 1-8, wherein the first electrode, the second electrode, and the third electrode each comprises a metal formed in an interlayer dielectric of a respective metallization layer and a diffusion barrier between the metal and the interlayer dielectric.

Example 10 includes the subject matter of any of Examples 1-9, wherein adjacent electrode fingers of the first metallization layer and adjacent electrode fingers of the second metallization layer are separated by a distance of 1 μm or less.

Example 11 includes the subject matter of Example 10, wherein adjacent electrode fingers of the first metallization layer and adjacent electrode fingers of the second metallization layer are separated by a distance of 500 nm or less.

Example 12 includes the subject matter of any of Examples 1-11, wherein the first line of the coupled line is electrically connected to a middle portion of the first electrode fingers and the second line is electrically connected to a middle portion of the second electrode fingers.

Example 13 includes the subject matter of any of Examples 1-12, wherein when the first line of the coupled line has a first electrical potential and the second line of the coupled line has a second electrical potential different from the first electrical potential, inductance of the first electrode fingers at least partially cancels inductance of the second electrode fingers.

Example 14 includes the subject matter of any of Example 3-5 or 7, wherein when the first line has a first electrical potential and the second line has a second electrical potential different from the first electrical potential, inductance of the first electrode fingers at least partially cancels inductance of the second electrode fingers, inductance of the fourth electrode at least partially cancels inductance of the first electrode, and inductance of the third electrode at least partially cancels inductance of the second electrode.

Example 15 includes the subject matter of any of Examples 1-14, wherein the first line is spaced from the second line by no more than 2 μm. In additional examples, the first line is spaced from the second line by no more than 1 μm.

Example 16 includes the subject matter of any of Example 1-15, wherein the integrated circuit has a resonant frequency of at least 100 GHz.

Example 17 includes the subject matter of any of Examples 1-16, wherein the integrated circuit has a capacitor area of at least 600 μm$^2$ and a capacitance density of 0.4 fF/μm$^2$.

Example 18 includes the subject matter of any of examples 1-17 and further comprises a dielectric material between the first metallization layer and the second metallization layer, the dielectric material having a dielectric constant of at least 2.

Example 19 includes the subject matter of Example 18, wherein the dielectric constant is at least 3.

Example 20 includes the subject matter of Example 18, wherein the dielectric constant is at least 4.

Example 21 includes the subject matter of Example 18, wherein the dielectric constant is at least 5.

Example 22 is an integrated circuit comprising: a first electrode pair in a first metallization layer and including a first electrode having a first bus with first electrode fingers connected to and extending in a first direction away from the first bus, and a second electrode having a second bus extending along and spaced from the first bus and having a plurality of second electrode fingers connected to and extending away from the second bus in a second direction opposite the first direction; a second electrode pair in a second metallization layer positioned below the first metallization layer, the second electrode pair including a third electrode having a third bus with third electrode fingers connected to the third bus and extending in the first direction away from the third bus, wherein each of the third electrode fingers is aligned below and corresponds to one of the first electrode fingers; and a fourth electrode having a fourth bus with fourth electrode fingers connected to the fourth bus and extending in the second direction away from the fourth bus, wherein the fourth bus extends along and is spaced from the third bus, and wherein the each of the fourth electrode fingers is positioned below and corresponds to one of the plurality of second electrode fingers; wherein the third bus is electrically connected to the second bus; and wherein the fourth bus is electrically connected to the first bus.

Example 23 includes the subject matter of Example 22 and further comprises a coupled line comprising a first line and a second line, wherein the first line is electrically connected to the first bus and the second line is electrically connected to the second bus.

Example 24 includes the subject matter of Example 23, wherein the first line defines a first terminal and a second terminal, the second line defines a third terminal and a fourth terminal, and the integrated circuit further comprises a transformer coupled to the second terminal and the fourth terminal and a differential FET amplifier coupled to the first terminal and the third terminal.

Example 25 includes the subject matter of Example 23, wherein when the first line has a first electrical potential and the second line has a second electrical potential different from the first electrical potential, inductance of the first electrode fingers at least partially cancels inductance of the third electrode fingers, and inductance of the second electrode fingers at least partially cancels inductance of the fourth electrode fingers.

Example 26 includes the subject matter of any of Examples 22-25, wherein the first line is spaced from the second line by no more than 2 µm. In additional examples, the first line is spaced from the second line by no more than 1 µm.

Example 27 includes the subject matter of any of Examples 22-26, wherein when the first line has first electrical potential and the second line has a second electrical potential different from the first potential, inductance of the first electrode fingers at least partially cancels inductance of the third electrode fingers and inductance of the second electrode fingers at least partially cancels inductance of the fourth electrode fingers.

Example 28 is an integrated circuit comprising a first electrode pair in a first metallization layer, the first electrode pair including a first electrode having a first bus with first electrode fingers connected to and extending in a first direction away from the first bus, and a second electrode having a second bus extending along and spaced from the first bus and having a plurality of second electrode fingers connected to and extending away from the second bus in a second direction opposite the first direction; isolated first fingers interspersed with the first electrode fingers, each of the isolated first fingers having an end portion adjacent the first bus and electrically connected to the first line, wherein each of the isolated first fingers is separated from the first electrode fingers and from the first bus by an isolation material; and isolated second fingers interspersed with the second electrode fingers, each of the isolated second fingers having an end portion adjacent the second bus and electrically connected to the second line, wherein each of the isolated second fingers is separated from the second electrode fingers and from the second bus by an isolation material; and a coupled line comprising a first line and a second line, wherein the first line is electrically coupled to the second bus and to the end portion of each of the isolated first fingers, and wherein the second line is electrically coupled to the first bus and to the end portion of each of the isolated second fingers.

Example 29 includes the subject matter of Example 28, wherein when the first line has a first electrical potential and the second line has a second electrical potential different from the first electrical potential, inductance of each of the isolated first fingers at least partially cancels inductance of an adjacent one of the first electrode fingers, and inductance of each of the isolated second fingers at least partially cancels inductance of an adjacent one of the second electrode fingers.

Example 30 includes the subject matter of Examples 28 or 29 and further comprises a second electrode pair in a second metallization layer below the first metallization layer, the second electrode pair including a third electrode having a third bus with third electrode fingers connected to and extending in the first direction away from the third bus, and a fourth electrode having a fourth bus extending along and spaced from the second bus and having a plurality of fourth electrode fingers connected to and extending away from the fourth bus in the second direction opposite the first direction.

Example 31 includes the subject matter of Example 30 and further comprises isolated third fingers interspersed with the third electrode fingers, each of the isolated third fingers having an end portion adjacent the third bus and electrically connected to the first bus, wherein each of the isolated third fingers is separated from the third electrode fingers and from the third bus by an isolation material; and isolated fourth fingers interspersed with the fourth electrode fingers, each of the isolated fourth fingers having an end portion adjacent the fourth bus and electrically connected to the second bus, wherein each of the isolated fourth fingers is separated from the fourth electrode fingers and from the fourth bus by an isolation material.

Example 32 includes the subject matter of Example 31, wherein when the first line has a first electrical potential and the second line has a second electrical potential different from the first potential, the integrated circuit exhibits horizontal inductance cancellation in the first electrode, the second electrode, the third electrode, and the fourth electrode, and the integrated circuit further exhibits vertical inductance cancellation between the first electrode and the third electrode and between the second electrode and the fourth electrode.

Example 33 includes the subject matter of Example 31, wherein (i) inductance of the first electrode fingers at least partially cancels inductance of corresponding ones of the third electrode fingers, (ii) inductance of the second electrode fingers at least partially cancels inductance of corresponding ones of the fourth electrode fingers, (iii) inductance of the first electrode fingers at least partially cancels inductance of the isolated first fingers, (iv) inductance of the second electrode fingers at least partially cancels inductance of the isolated second fingers, (v) inductance of the first electrode fingers or the isolated first fingers at least partially cancels inductance of the isolated third fingers or the third electrode fingers, and (vi) inductance of the second electrode fingers or the isolated second fingers at least partially cancels inductance of the fourth electrode fingers or the isolated fourth fingers.

Example 34 includes the subject matter of any of Examples 30 or 31 and further comprises: a third electrode pair having a fifth electrode and a sixth electrode in a third metallization layer below the second metallization layer, the fifth electrode having a fifth bus with fifth electrode fingers extending in the first direction away from the fifth bus, and the sixth electrode having a sixth bus with sixth electrode fingers extending away from the sixth bus in the second direction, wherein the fifth bus extends along and adjacent to the sixth bus; wherein the fifth bus is electrically connected to the fourth bus, and wherein the sixth bus is electrically connected to the third bus.

Example 35 includes the subject matter of Example 34 and further comprises: isolated fifth fingers interspersed with the fifth electrode fingers, wherein an end portion adjacent the fifth bus of each of the isolated fifth fingers is connected to the third bus, and wherein each of the isolated fifth fingers is separated from the fifth electrode fingers and from the fifth bus by an isolation material of the third metallization layer; and isolated sixth fingers interspersed with the sixth electrode fingers, wherein an end portion adjacent the sixth bus of each of the isolated sixth fingers is connected to the fourth bus, wherein each of the isolated sixth fingers is separated from the sixth electrode fingers and from the sixth bus by the isolation material of the third metallization layer.

Example 36 includes the subject matter of any of Examples 30-35, wherein when the first line has a first electrical potential and the second line has a second electrical potential different from the first potential, the integrated circuit exhibits horizontal inductance cancellation in the first electrode, the second electrode, the third electrode, and the fourth electrode, and the integrated circuit exhibits vertical inductance cancellation between the first electrode and the third electrode and between the second electrode and the fourth electrode.

Example 37 includes the subject matter of Example 36, wherein (i) inductance of the first electrode fingers at least partially cancels inductance of corresponding ones of the third electrode fingers, (ii) inductance of the second electrode fingers at least partially cancels inductance of corresponding ones of the fourth electrode fingers, (iii) inductance of the first electrode fingers at least partially cancels inductance of the isolated first fingers, (iv) inductance of the second electrode fingers at least partially cancels inductance of the isolated second fingers, (v) inductance of the first electrode fingers or the isolated first fingers at least partially cancels inductance of the isolated third fingers or the third electrode fingers, and (vi) inductance of the second electrode fingers or the isolated second fingers at least partially cancels inductance of the fourth electrode fingers or the isolated fourth fingers.

Example 38 includes the subject matter of any of Examples 28-37, wherein the first line defines a first terminal and a second terminal, the second line defines a third terminal and a fourth terminal, and the integrated circuit further comprises: a transformer coupled to the first terminal and the third terminal; and a differential FET amplifier coupled to the second terminal and the fourth terminal.

Example 39 includes the subject matter of Example 38, wherein the transformer is a high-k coupling transformer.

Example 40 includes the subject matter of Example 38, wherein the transformer is a low-k coupling transformer.

Example 41 includes the subject matter of any of Examples 28-40, wherein the integrated circuit has one or more of (i) a resonant frequency of at least 120 GHz, (ii) a capacitance area of at least 1000 $\mu m^2$, or (iii) a capacitance density of at least 0.2 $fF/\mu m^2$.

Example 42 includes the subject matter of any of Examples 28-40, wherein the integrated circuit has one or more of (i) a resonant frequency of at least 100 GHz, (ii) a capacitance area of at least 1300 $\mu m^2$, or (iii) a capacitance density of at least 0.3 $fF/\mu m^2$.

Example 43 includes the subject matter of any of Examples 22-42 and further comprises a dielectric material between the first electrode pair and the second electrode pair, the dielectric material having a dielectric constant of at least 2.

Example 44 includes the subject matter of Example 43, wherein the dielectric constant is at least 3.

Example 45 includes the subject matter of Example 43, wherein the dielectric constant is at least 4.

Example 46 includes the subject matter of Example 43, wherein the dielectric constant is at least 5.

Example 47 includes the subject matter of any of Examples 28-46, wherein the first line is spaced from the second line by no more than 2 µm.

Example 48 includes the subject matter of Example 47, wherein the first line is spaced from the second line by no more than 1 µm.

Example 49 is a method for simulating an integrated circuit, the method comprising simulating an integrated circuit using a simulation model that includes a capacitor model with electrode fingers comprising one or more metals and having a finger length, wherein the capacitor model models capacitance between electrode fingers and includes at least one resistor-capacitor series circuit in which an additive component of resistance of the resistor increases with decreasing finger length for at least some values of the finger length.

Example 50 includes the subject matter of Example 49, wherein the capacitor model models the additive component of resistance decreasing with increasing frequency of the integrated circuit.

Example 51 includes the subject matter of Example 49, wherein simulating the integrated circuit includes simulating a first electrode pair in a first metallization layer and one or more electrode in a second metallization layer vertically below the first metallization layer, wherein inductance of the first electrode pair is at least partially canceled by inductance of the one or more electrode in the second metallization layer.

Example 52 includes the subject matter of Example 49 or 50, wherein the simulation model includes a coupled line model coupled to the capacitor model, and wherein the coupled line model includes a first line modeled by a first resistive element and a first inductive element, the first line having a first terminal and a second terminal, and includes a second line modeled by a second resistive element and a second inductive element, the second line having a third terminal and a fourth terminal.

Example 53 includes the subject matter of Example 50, wherein the simulation model further includes a fifth terminal corresponding to a reference potential of the integrated circuit, the fifth terminal coupled to one or more of the first terminal, the second terminal, the third terminal, and the fourth terminal of the coupled line model.

Example 54 includes the subject matter of Example 50, wherein simulating the integrated circuit includes simulating increasing resistance with increasing frequency for at least one of the first resistive element and the second resistive element and simulating decreasing inductance with increasing frequency for at least one of the first inductive element and the second inductive element.

Example 55 includes the subject matter of Example 50, wherein simulating the integrated circuit includes simulating mutual inductance of the first inductive element coupled to a first inductive closed loop defined by the second line electrically connected to a second electrode of the capacitor model, and simulating mutual inductance of the second inductive element coupled to a second inductive closed loop defined by the first line electrically connected to a first electrode of the capacitor model.

Example 56 includes the subject matter of Example 50 and further comprises simulating current flow through the first line and the second line; and simulating an integrated circuit having a first resonant circuit between the first terminal and the third terminal, and a second resonant circuit between the second terminal and the fourth terminal, wherein the first resonant circuit and the second resonant circuit can be modeled by a resistor-inductor-capacitor series circuit in which resistance of the resistor increases as a capacitor finger length decreases for at least some values of the capacitor finger length.

Example 57 includes the subject matter of Example 50, wherein simulating the integrated circuit includes simulating mutual inductance between the first inductive element and the second inductive element.

Example 58 includes the subject matter of Example 50, wherein simulating the integrated circuit includes modeling a skin effect of the first resistive element and second resistive element as having a resistance that increases with frequency and that depends on a first cross-sectional dimension of the first line and a second cross-sectional dimension of the second line, respectively.

Example 59 includes the subject matter of Example 57, wherein simulating the integrated circuit includes modeling a skin effect of the first inductive element and the second inductive element as having decreasing inductance with increasing frequency, wherein the skin effect of the first inductive element depends on a frequency range of the capacitor model and the first cross-sectional dimension, and wherein the skin effect of the second inductive element depends on the frequency range of the capacitor model and the second cross-sectional dimension.

Example 60 includes the subject matter of Example 58 or 59, wherein simulating the integrated circuit includes modeling mutual inductances corresponding to magnetic coupling of the first inductive element and the second inductive element to closed loops inside the capacitor model.

Example 61 includes the subject matter of Example 55, wherein simulating the integrated circuit includes modeling the closed loops of the capacitor model as having a loop resistive element with a loop resistance and a loop inductive element with a loop inductance.

Example 62 includes the subject matter of Example 61, and further comprises simulating current flow through the first inductive element and the second inductive element in the same direction, wherein magnetic fields of the first line and the second line add together and induce currents in the closed loops.

Example 63 includes the subject matter of Example 62, wherein the current flow through the first inductive element and the second inductive element is a common mode excitation of the coupled line.

Example 64 is a method of simulating a capacitor structure, the method comprising simulating a capacitor with electrode fingers having a finger length, the finger capacitor modeled by a series circuit with a resistor, an inductor, and a capacitor, wherein a component of resistance increases with decreasing finger length.

Example 65 includes the subject matter of Example 64, wherein the component of resistance is surface resistance.

Example 66 includes the subject matter of Examples 64 or 65, wherein at least some values of resistance decrease with increasing operating frequency.

Example 67 is a computer program product including one or more non-transitory machine-readable mediums encoded with instructions that when executed by one or more processors cause a process to be carried out for simulating an integrated circuit, the process comprising simulating an integrated circuit using a simulation model that includes a capacitor model with electrode fingers comprising one or more metal and defining a finger length, wherein the capacitor model models capacitance between electrode fingers and includes at least one resistor-capacitor series circuit in which an additive component of resistance of the resistor increases with decreasing finger length L for at least some values of the finger length L.

Example 68 includes the subject matter of Example 67, wherein the capacitor model models the additive component of resistance decreasing with increasing frequency of the integrated circuit.

Example 69 is a data structure encoded on one or more non-transitory machine-readable mediums that, when accessed by one or more processors, causes a process to be carried out for simulating an integrated circuit, the process comprising simulating an integrated circuit using a simulation model included in the data structure and that includes a capacitor model with electrode fingers comprising one or more metal and defining a finger length, wherein the capacitor model models capacitance between electrode fingers and includes at least one resistor-capacitor series circuit in which an additive component of resistance of the resistor increases with decreasing finger length L for at least some values of the finger length L.

Example 70 includes the subject matter of Example 69, wherein the capacitor model models the additive component of resistance decreasing with increasing frequency of the integrated circuit.

Example 71 includes the subject matter of Examples 69 or 70, wherein the data structure comprises a parasitic extraction runset. For example, a parasitic extraction runset can be computer code used by parasitic extraction software to calculate the parasitic capacitance and resistance of metal wires (or electrode fingers, coupled lines, or other metal structures) in an integrated circuit. A change in metal thickness impacts resistance and capacitance of metal wires. The runset defines capacitance and resistance values for a given wire width and a given wire spacing. For example, parasitic extraction tools use table-based models which provide resistance and capacitance values for each width and spacing. In some runsets, the change in geometric dimensions versus the magnitude of the geometric dimensions are considered and are known as optical proximity correction. The change in metal thickness versus the density of metal filling structures (called dummy structures) can also be considered. In some embodiments, the runset provides table-based values for the models used in the parasitic extraction software.

Example 72 is a computer program product including one or more non-transitory machine-readable mediums encoded with instructions that when executed by one or more processors cause a process to be carried out for simulating an integrated circuit, the process comprising: simulating an integrated circuit using a simulation model that includes a capacitor model coupled to a coupled line model, the capacitor model having electrode fingers comprising one or more metal and defining a finger length; wherein the capacitor model models capacitance between electrode fingers and includes at least one resistor-capacitor series circuit in which an additive component of resistance of the resistor increases with decreasing finger length for at least some values of the finger length; and wherein the coupled line model includes a first line modeled by a first resistive element and a first inductive element, the first line having a first terminal and a second terminal, and includes a second line modeled by a second resistive element and a second inductive element, the second line having a third terminal and a fourth terminal.

Example 73 includes the subject matter of Example 72, wherein the simulation model further includes a fifth terminal corresponding to a reference potential of the integrated circuit, the fifth terminal coupled to one or more of the first terminal, the second terminal, the third terminal, and the fourth terminal of the coupled line model.

Example 74 includes the subject matter of Example 72, wherein simulating the integrated circuit includes simulating mutual inductance between the first inductive element and the second inductive element.

Example 75 includes the subject matter of Example 72, wherein simulating the integrated circuit comprises simulating decreasing resistance with increasing frequency for at least one of the first resistive element or the second resistive element: and simulating decreasing inductance with increasing frequency for at least one of the first inductive element or the second inductive element.

Example 76 includes the subject matter of any of Examples 72-75, wherein simulating the integrated circuit includes simulating a differential FET model coupled to the second terminal and the fourth terminal, and includes a transformer model coupled to the first terminal and the third terminal.

Example 77 is a data structure encoded on one or more non-transitory machine-readable mediums that, when accessed by one or more processors, causes a process to be carried out for simulating an integrated circuit, the process comprising simulating an integrated circuit using a simulation model encoded in the data structure and that includes a capacitor model coupled to a coupled line model; wherein the capacitor model models capacitance between electrode fingers comprising one or more metal and defining a finger length L and includes at least one resistor-capacitor series circuit in which an additive component of resistance of the resistor increases with decreasing finger length for at least some values of the finger length; and wherein the coupled line model includes a first line modeled by a first resistive element and a first inductive element, the first line having a first terminal and a second terminal, and includes a second line modeled by a second resistive element and a second inductive element, the second line having a third terminal and a fourth terminal.

Example 78 includes the subject matter of Example 77, wherein the simulation model further includes a fifth terminal corresponding to a reference potential of the integrated circuit, the fifth terminal coupled to one or more of the first terminal, the second terminal, the third terminal, or the fourth terminal of the coupled line model.

Example 79 includes the subject matter of Example 77, wherein simulating the integrated circuit includes simulating mutual inductance between the first inductive element and the second inductive element.

Example 80 includes the subject matter of Example 77, wherein simulating the integrated circuit includes simulating decreasing resistance with increasing frequency for at least one of the first resistive element or the second resistive element and simulating decreasing inductance with increasing frequency for at least one of the first inductive element or the second inductive element.

Example 81 includes the subject matter of any of Examples 77-80, wherein the simulation model includes a differential FET model coupled to the second terminal and the fourth terminal, and includes a transformer model coupled to the first terminal and the third terminal.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein.

What is claimed is:

1. An integrated circuit comprising:
a first metallization layer comprising a first electrode with first electrode fingers extending in a first direction from a first bus, the first bus extending transversely to and connected to respective ends of the first electrode fingers; and
a second electrode with second electrode fingers extending in a second direction opposite the first direction from a second bus, the second bus extending transversely to and connected to respective ends of the second electrode fingers, wherein the first electrode fingers are interdigitated with the second electrode fingers, and the first bus is spaced from the second bus with the first electrode fingers and the second electrode fingers extending therebetween;
a second metallization layer below the first metallization layer and comprising a third electrode with third electrode fingers extending from a third bus in the first direction, the third bus extending transversely to and connected to respective ends of the third electrode fingers, wherein each of the third electrode fingers is positioned vertically below and corresponds to one of the second electrode fingers, and wherein the third bus is connected to the first bus; and
a coupled line comprising a first line and a second line, wherein the first line is connected to the first electrode fingers between the first bus and the second bus, and the second line is connected to the second electrode fingers between the first bus and the second bus.

2. The integrated circuit of claim 1 further comprising:
a fourth electrode with fourth electrode fingers extending from a fourth bus in the second direction, the fourth bus extending transversely to and connected to respective ends of the fourth electrode fingers, wherein each of the fourth electrode fingers is positioned vertically below and corresponds to one of the first electrode fingers, and wherein the fourth electrode fingers are interdigitated with the third electrode fingers, and the third bus is spaced from the fourth bus with the third electrode fingers and the fourth electrode fingers extending therebetween, and wherein the fourth bus is connected to the second bus.

3. The integrated circuit of claim 2 further comprising:
an additional metallization layer below the second metallization layer, and including a fifth electrode with fifth electrode fingers extending from a fifth bus in the first direction, the fifth bus extending transversely to and connected to respective ends of the fifth electrode fingers, wherein each of the fifth electrode fingers is positioned vertically below and corresponds to one of the fourth electrode fingers; and
a sixth electrode with sixth electrode fingers extending from a sixth bus, the sixth bus extending transversely to and connected to respective ends of the sixth electrode fingers, wherein each of the plurality of sixth electrode fingers is positioned vertically below and corresponds to one of the third electrode fingers, and wherein the sixth electrode fingers are interdigitated with the fifth electrode fingers, and the sixth bus is spaced from the fifth bus with the fifth electrode fingers and the sixth electrode fingers extending therebetween; wherein the fifth bus is connected to the third bus and the sixth bus is connected to the fourth bus.

4. The integrated circuit of claim 1, wherein when the first line has a first electrical potential and the second line has a second electrical potential different from the first electrical potential, and inductance of the first electrode fingers at least partially cancels inductance of the second electrode fingers.

5. The integrated circuit of claim 4, wherein inductance of the fourth electrode at least partially cancels inductance of the first electrode, and inductance of the third electrode at least partially cancels inductance of the second electrode.

6. The integrated circuit of claim 1, wherein the first line has a first terminal and a second terminal and the second line has a third terminal and a fourth terminal, the integrated circuit further comprising:
- a differential FET amplifier coupled to the second terminal and the fourth terminal; and a transformer coupled to the first terminal and the third terminal.

7. The integrated circuit of claim 1 further comprising a dielectric material between the first metallization layer and the second metallization layer, the dielectric material having a dielectric constant of at least 2.

8. An integrated circuit comprising:
- a first electrode pair in a first metallization layer and including a first electrode having a first bus with first electrode fingers connected to and extending in a first direction away from the first bus; and
- a second electrode having a second bus extending along and spaced from the first bus and having a plurality of second electrode fingers connected to and extending away from the second bus in a second direction opposite the first direction;
- a second electrode pair in a second metallization layer positioned below the first metallization layer, the second electrode pair including a third electrode having a third bus with third electrode fingers connected to the third bus and extending in the first direction away from the third bus, wherein each of the third electrode fingers is aligned below and corresponds to one of the first electrode fingers;
- a fourth electrode having a fourth bus with fourth electrode fingers connected to the fourth bus and extending in the second direction away from the fourth bus, wherein the fourth bus extends along and is spaced from the third bus, and wherein the each of the fourth electrode fingers is positioned below and corresponds to one of the plurality of second electrode fingers; wherein the third bus is electrically connected to the second bus; and wherein the fourth bus is electrically connected to the first bus; and
- a coupled line comprising a first line and a second line, wherein the first line is electrically connected to the first bus and the second line is electrically connected to the second bus.

9. The integrated circuit of claim 8, wherein the first line defines a first terminal and a second terminal, the second line defines a third terminal and a fourth terminal, and the integrated circuit further comprises:
- a transformer coupled to the second terminal and the fourth terminal; and
- a differential FET amplifier coupled to the first terminal and the third terminal.

10. The integrated circuit of claim 8, wherein when the first line has a first electrical potential and the second line has a second electrical potential different from the first electrical potential, inductance of the first electrode fingers at least partially cancels inductance of the third electrode fingers, and inductance of the second electrode fingers at least partially cancels inductance of the fourth electrode fingers.

11. The integrated circuit of claim 8, wherein the first line is spaced from the second line by no more than 2 μm.

12. An integrated circuit comprising:
- a first electrode pair in a first metallization layer, the first electrode pair including a first electrode having a first bus with first electrode fingers connected to and extending in a first direction away from the first bus; and
- a second electrode having a second bus extending along and spaced from the first bus and having a plurality of second electrode fingers connected to and extending away from the second bus in a second direction opposite the first direction, isolated first fingers interspersed with the first electrode fingers, each of the isolated first fingers having an end portion adjacent the first bus and electrically connected to the first line, wherein each of the isolated first fingers is separated from the first electrode fingers and from the first bus by an isolation material; and isolated second fingers interspersed with the second electrode fingers, each of the isolated second fingers having an end portion adjacent the second bus and electrically connected to the second line, wherein each of the isolated second fingers is separated from the second electrode fingers and from the second bus by an isolation material; and
- a coupled line comprising a first line and a second line, wherein the first line is electrically coupled to the second bus and to the end portion of each of the isolated first fingers, and wherein the second line is electrically coupled to the first bus and to the end portion of each of the isolated second fingers.

13. The integrated circuit of claim 12, wherein when the first line has a first electrical potential and the second line has a second electrical potential different from the first electrical potential, inductance of each of the isolated first fingers at least partially cancels inductance of an adjacent one of the first electrode fingers, and inductance of each of the isolated second fingers at least partially cancels inductance of an adjacent one of the second electrode fingers.

14. The integrated circuit of claim 12, wherein the first line defines a first terminal and a second terminal, the second line defines a third terminal and a fourth terminal, and the integrated circuit further comprises: a transformer coupled to the second terminal and the fourth terminal; and a differential FET amplifier coupled to the first terminal and the third terminal.

15. The integrated circuit of claim 12 further comprising:
- a second electrode pair in a second metallization layer below the first metallization layer, the second electrode pair including a third electrode having a third bus with third electrode fingers connected to and extending in the first direction away from the third bus; and
- a fourth electrode having a fourth bus extending along and spaced from the second bus and having a plurality of fourth electrode fingers connected to and extending away from the fourth bus in the second direction opposite the first direction.

16. The integrated circuit of claim 15 further comprising:
- isolated third fingers interspersed with the third electrode fingers, each of the isolated third fingers having an end portion adjacent the third bus and electrically connected to the first bus, wherein each of the isolated third fingers is separated from the third electrode fingers and from the third bus by an isolation material; and
- isolated fourth fingers interspersed with the fourth electrode fingers, each of the isolated fourth fingers having an end portion adjacent the fourth bus and electrically connected to the second bus, wherein each of the isolated fourth fingers is separated from the fourth electrode fingers and from the fourth bus by an isolation material.

17. The integrated circuit of claim 16, wherein when the first line has a first electrical potential and the second line has a second electrical potential different from the first potential, the integrated circuit exhibits horizontal inductance cancellation in the first electrode, the second electrode, the third electrode, and the fourth electrode, and the integrated circuit further exhibits vertical inductance cancellation between the first electrode and the third electrode and between the second electrode and the fourth electrode.

18. The integrated circuit of claim 16, wherein (i) inductance of the first electrode fingers at least partially cancels inductance of corresponding ones of the third electrode fingers, (ii) inductance of the second electrode fingers at least partially cancels inductance of corresponding ones of the fourth electrode fingers, (iii) inductance of the first electrode fingers at least partially cancels inductance of the isolated first fingers, (iv) inductance of the second electrode fingers at least partially cancels inductance of the isolated second fingers, (v) inductance of the first electrode fingers or the isolated first fingers at least partially cancels inductance of the isolated third fingers or the third electrode fingers, and (vi) inductance of the second electrode fingers or the isolated second fingers at least partially cancels inductance of the fourth electrode fingers or the isolated fourth fingers.

19. The integrated circuit of claim 16, wherein the integrated circuit has one or more of (i) a resonant frequency of at least 100 GHz, (ii) a capacitance area of at least 1300 $\mu m^2$, or (iii) a capacitance density of at least 0.3 $fF/\mu m^2$.

20. An integrated circuit comprising:
   a first electrode pair in a first metallization layer and including a first electrode having a first bus with first electrode fingers connected to and extending in a first direction away from the first bus; and
   a second electrode having a second bus extending along and spaced from the first bus and having a plurality of second electrode fingers connected to and extending away from the second bus in a second direction opposite the first direction, wherein the second electrode fingers face away from the first electrode fingers, wherein the first electrode fingers face away from the second electrode fingers, and wherein the first electrode fingers are in alignment with the second electrode fingers;
   a second electrode pair in a second metallization layer positioned below the first metallization layer, wherein the second metallization layer is an immediately next metallization layer to the first metallization layer, the second electrode pair including a third electrode having a third bus with third electrode fingers connected to the third bus and extending in the first direction away from the third bus, wherein each of the third electrode fingers is aligned below and corresponds to one of the first electrode fingers;
   a fourth electrode having a fourth bus with fourth electrode fingers connected to the fourth bus and extending in the second direction away from the fourth bus, wherein the fourth bus extends along and is spaced from the third bus, and wherein the each of the fourth electrode fingers is positioned below and corresponds to one of the plurality of second electrode fingers, wherein the fourth electrode fingers face away from the third electrode fingers, wherein the third electrode fingers face away from the fourth electrode fingers, and wherein the third electrode fingers are in alignment with the fourth electrode fingers; wherein the third bus is electrically connected to the second bus; and wherein the fourth bus is electrically connected to the first bus.

\* \* \* \* \*